United States Patent
Andosca et al.

(10) Patent No.: US 9,479,089 B2
(45) Date of Patent: Oct. 25, 2016

(54) PIEZOELECTRIC ENERGY HARVESTER DEVICE WITH A STOPPER STRUCTURE, SYSTEM, AND METHODS OF USE AND MAKING

(71) Applicant: MicroGen Systems, Inc., West Henrietta, NY (US)

(72) Inventors: Robert G. Andosca, Fairport, NY (US); T. Gus McDonald, Victor, NY (US); David Trauernicht, Rochester, NY (US); Kathleen M. Vaeth, Fairport, NY (US)

(73) Assignee: Microgen Systems, Inc., West Henrietta, NY (US)

( * ) Notice: Subject to any disclaimer, the term of this patent is extended or adjusted under 35 U.S.C. 154(b) by 272 days.

(21) Appl. No.: 14/145,560

(22) Filed: Dec. 31, 2013

(65) Prior Publication Data

US 2015/0188458 A1 Jul. 2, 2015

Related U.S. Application Data

(60) Provisional application No. 61/780,247, filed on Mar. 13, 2013.

(51) Int. Cl.
  *H01L 41/113* (2006.01)
  *H02N 2/18* (2006.01)
  (Continued)

(52) U.S. Cl.
  CPC .............. *H02N 2/186* (2013.01); *F03G 7/08* (2013.01); *H01L 41/1136* (2013.01); *H02N 2/181* (2013.01); *H02N 2/188* (2013.01); *H02N 2/22* (2013.01)

(58) Field of Classification Search
  CPC .......................... G01C 19/5607; G01L 1/16

USPC .................................................. 310/311–371
See application file for complete search history.

(56) References Cited

U.S. PATENT DOCUMENTS 3,976,899 A * 8/1976 Fanshawe ............ H03K 17/964
                                                                                            310/339
4,445,256 A     5/1984 Huguenin et al.
(Continued)

FOREIGN PATENT DOCUMENTS

JP        2003-37312    *   2/2003  ........... H01L 43/08
WO      WO 03/096521      11/2003

OTHER PUBLICATIONS

International Search Report, corresponding to PCT/US14/65628, mailed Jul. 24, 2015.

(Continued)

*Primary Examiner* — Thomas Dougherty
(74) *Attorney, Agent, or Firm* — LeClairRyan, a Professional Corporation

(57) ABSTRACT

The present invention relates to an energy harvester device comprising an elongate resonator beam comprising a piezoelectric material, the resonator beam extending between first and second ends; a base connected to the resonator beam at the first end with the second end being freely extending from the base as a cantilever; a mass attached to the second end of the resonator beam; a package surrounding at least a portion of the second end of the resonator beam; and a stopper connected to the mass and/or the second end of the resonator beam, where the stopper is configured to prevent contact between the second end of the resonator beam and the package. Also disclosed is a system, a method of powering an electrically powered apparatus, and methods of producing an anergy harvester device.

44 Claims, 21 Drawing Sheets

(51) Int. Cl.
*F03G 7/08* (2006.01)
*H02N 2/00* (2006.01)

(56) References Cited

U.S. PATENT DOCUMENTS

| | | | |
|---|---|---|---|
| 5,248,912 | A | 9/1993 | Zdeblick et al. |
| 5,646,583 | A | 7/1997 | Seabury et al. |
| 5,708,320 | A | 1/1998 | Ohnishi et al. |
| 6,078,126 | A | 6/2000 | Rollins et al. |
| 6,396,201 | B1 | 5/2002 | Ide et al. |
| 6,796,011 | B2 | 9/2004 | Takeuchi et al. |
| 6,858,970 | B2 | 2/2005 | Malkin et al. |
| 7,839,058 | B1 | 11/2010 | Churchill et al. |
| 7,919,345 | B1 | 4/2011 | Kirsten et al. |
| 8,080,920 | B2 | 12/2011 | Andosca et al. |
| 8,222,754 | B1 * | 7/2012 | Soliman ............... F03G 7/08 290/1 R |
| 8,319,402 | B1 | 11/2012 | Churchill et al. |
| 9,054,294 | B2 * | 6/2015 | Haskett ............... H01L 41/053 |
| 2003/0214200 | A1 | 11/2003 | Thompson et al. |
| 2004/0115711 | A1 | 6/2004 | Su et al. |
| 2005/0134149 | A1 | 6/2005 | Deng et al. |
| 2005/0205125 | A1 | 9/2005 | Nersessian et al. |
| 2005/0253486 | A1 | 11/2005 | Schmidt |
| 2007/0125176 | A1 | 6/2007 | Liu |
| 2009/0200896 | A1 | 8/2009 | Morris et al. |
| 2009/0205435 | A1 * | 8/2009 | Buck ............... B60C 23/0411 73/753 |
| 2009/0284102 | A1 | 11/2009 | Karakaya et al. |
| 2010/0019623 | A1 | 1/2010 | Yao et al. |
| 2010/0072759 | A1 | 3/2010 | Andosca et al. |
| 2010/0194240 | A1 | 8/2010 | Churchill et al. |
| 2011/0264293 | A1 | 10/2011 | Forrest et al. |
| 2011/0277286 | A1 | 11/2011 | Zhang |
| 2011/0309618 | A1 | 12/2011 | Gieras et al. |
| 2012/0049694 | A1 | 3/2012 | Van Schaijk et al. |
| 2013/0088123 | A1 | 4/2013 | Haskett |
| 2013/0341936 | A1 | 12/2013 | Wood et al. |
| 2014/0265726 | A1 | 9/2014 | Andosca |
| 2015/0221855 | A1 * | 8/2015 | Vaeth ............... H01L 41/1136 310/319 |
| 2015/0295520 | A1 * | 10/2015 | Hasegawa ............... H02N 2/188 310/323.01 |

OTHER PUBLICATIONS

International Search Report for International Patent Application No. PCT/US2014/021905 (Aug. 15, 2014).
International Search Report for International Patent Application No. PCT/US2014/035296 (Aug. 22, 2014).
Altena G., et al., "Design improvements for an electret-based MEMS vibrational electrostatic energy harvester", Journal of Physics: Conference Series 476 (2013) 012078, PowerMEMS2013, pp. 371-374, IOP Publishing.
Andosca R., et al., "Experimental and theoretical studies on MEMS piezoelectric vibrational energy harvesters with mass loading", Sensors and Actuators A: Physical, 2012, pp. 1-12, Elsevier B.V.
Beeby et al., "Energy harvesting vibration sources for microsystems applications," Meas. Sci. Technol., Measurement Science and Technology, 2006, pp. R175-R195, IOP Publishing Ltd.
Elfrink R., et al., "Vaccum Packaged MEMS Piezoelectric Vibration Energy Harvester", PowerMEMS, 2009, pp. 67-70.
Gu L, et al., "Impact-driven, frequency up-converting coupled vibration energy harvesting device for low frequency operation", Smart Mater, Struct., 20, Mar. 8, 2011, pp. 1-10, IOP Publishing.
Marzencki, M., et al., "A MEMS Piezoelectric Vibration Energy Harvesting Device", PowerMEMS, Nov. 28-30, 2005, pp. 45-48.
Renaud M., et al., "Optimum power and efficiency of piezoelectric vibration energy harvesters with sinusoidal and random vibrations", J. Micromech, Microeng. 22, Sep. 10, 2012, pp. 1-13, IOP Publishing.
Schroder C., et al., "Wafer-Level Packaging of ALN-Based Piezoelectric Micropower Generators", PowerMEMS, Dec. 2-5, 2012, pp. 343-346.
Schroder C., et al., "ALN-Based Piezoelectric Micropower Generator for Low Ambient Vibration Energy Harvesting", 2011,pp. 1-4.
Singh K., et al., "Piezoelectric vibration energy harvesting system with an adaptive frequency tuning mechanism for intelligent tires", Mechatronics 22, Jul. 31, 2012, pp. 970-988, Elsevier, Ltd.
Stoppel et al., "A1N-Based piezoelectric micropower generator for low ambient vibration energy harvesting," Porcedia Engineer. 25, Sep. 4-7, 2011, pp. 721-724, Elsevier, Ltd.
Tang L., et al., "Toward Broadband Vibration-based Energy Harvesting", Journal of Intelligent Material Systems and Structures, vol. 21, Dec. 2010, pp. 1867-1897, Sage Publications.
Schaijk, R., et al., "A MEMS vibration energy harvester for automotive applications", Proc. of SPIE vol. 8763, 2013, pp. 1-10.
Wang Z., et al., "Shock Reliability of Vacuum-Packaged Piezoelectric Vibration Harvester for Automotive Application", Journal of Microelectromechanical Systems, vol. 23, No. 3, Jun. 2014, pp. 539-548, IEEE.
Zhu D., et al., "Strategies for increasing the operating frequency range of vibration energy harvesters: a review", Meas. Sci. Technol. 21, Dec. 15, 2010, pp. 1-29, IOP Publishing.
International Search Report for International Patent Application No. PCT/US2014/014797 (May 23, 2014).
International Search Report for International Patent Application No. PCT/US2013/78520 (May 4, 2014).
International Search Report for International Patent Application No. PCT/US2014/035318 (Dec. 31, 2014).
European Search Report for European Application No. 13877574.7 (Aug. 1, 2016), pp. 1-6.
International Search Report for International Patent Application No. PCT/US2014/014797 (Aug. 18, 2016), pp. 1-6.

* cited by examiner

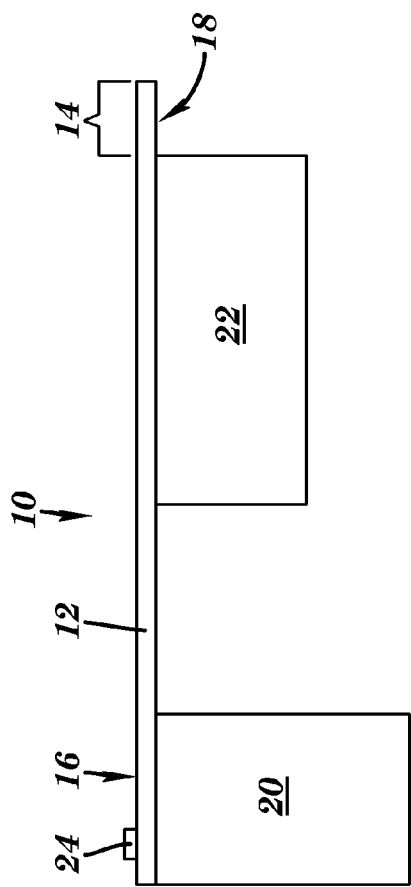
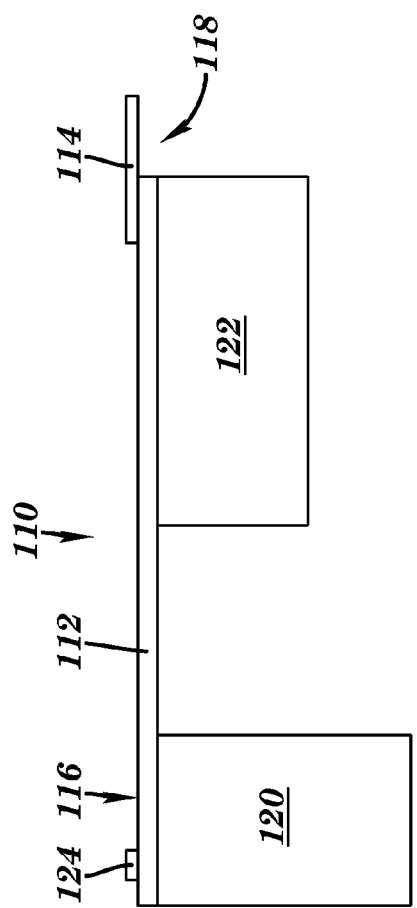

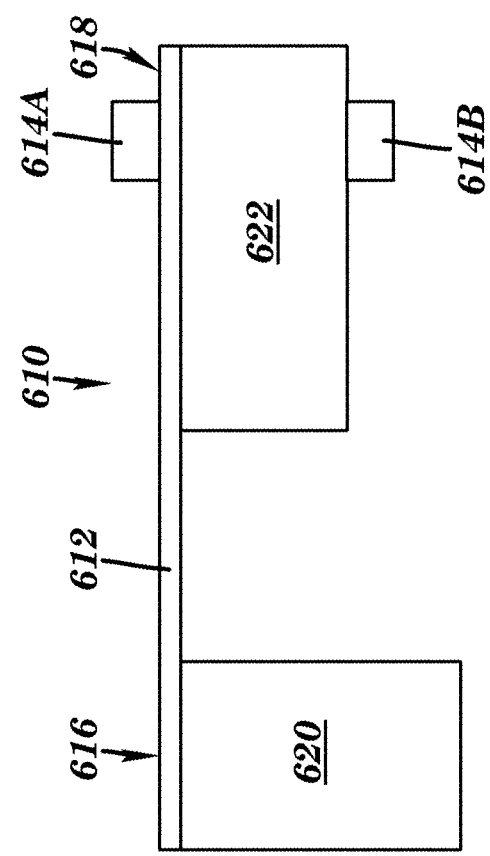

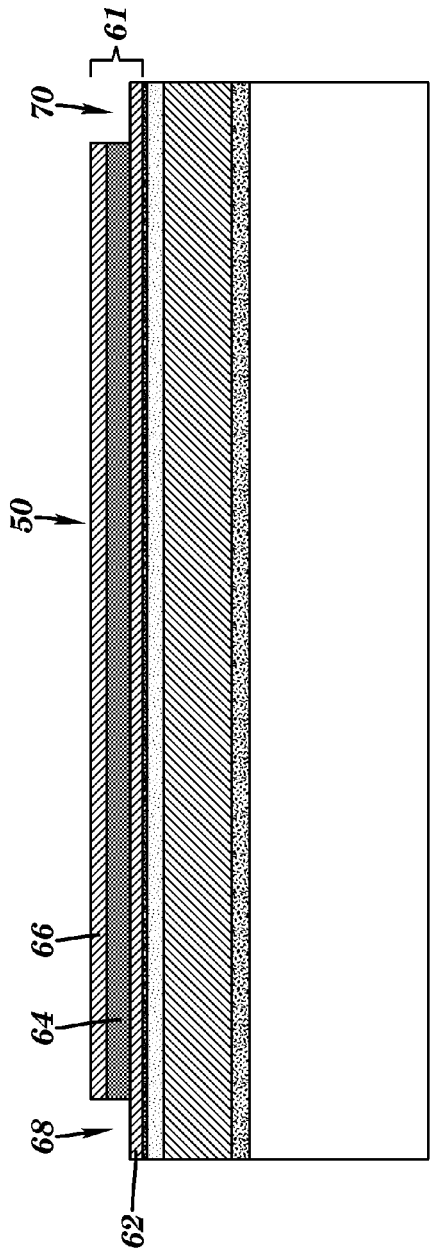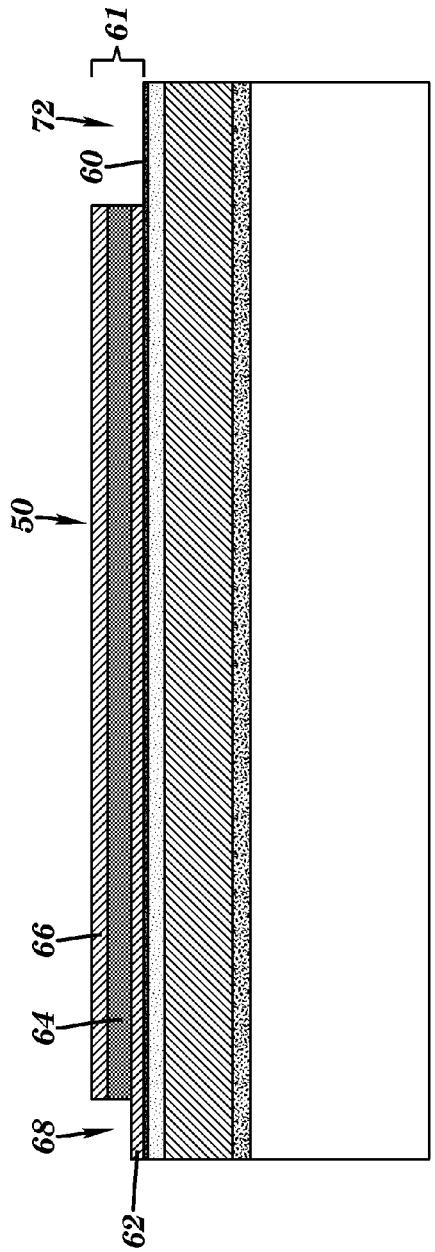

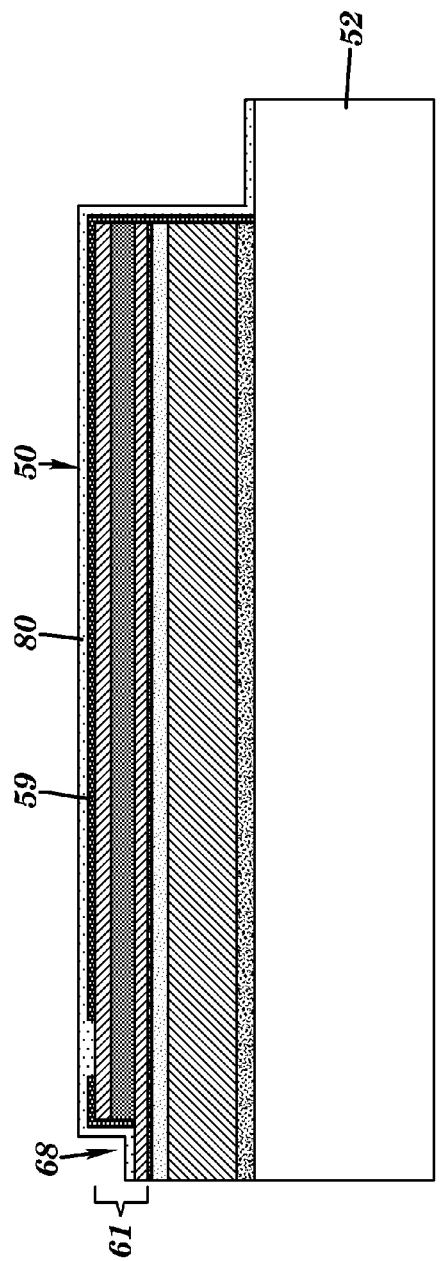
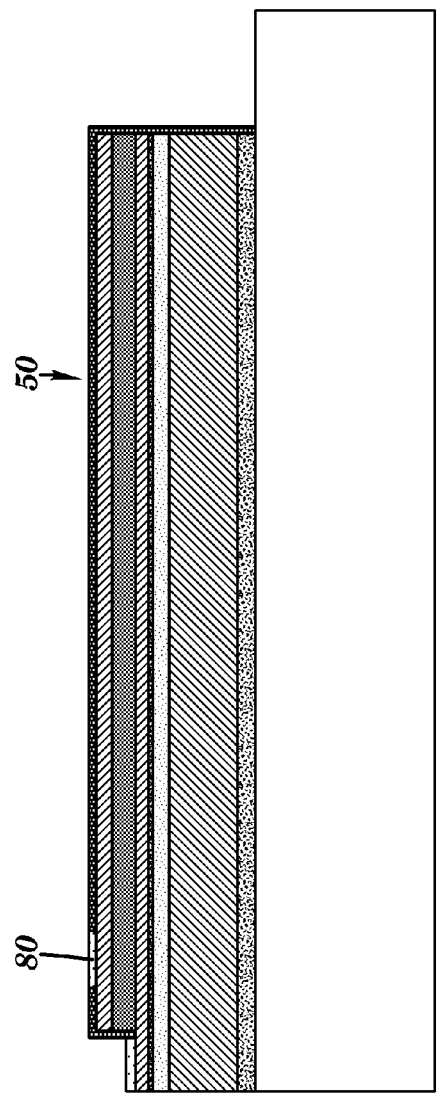
FIG. 17
FIG. 18

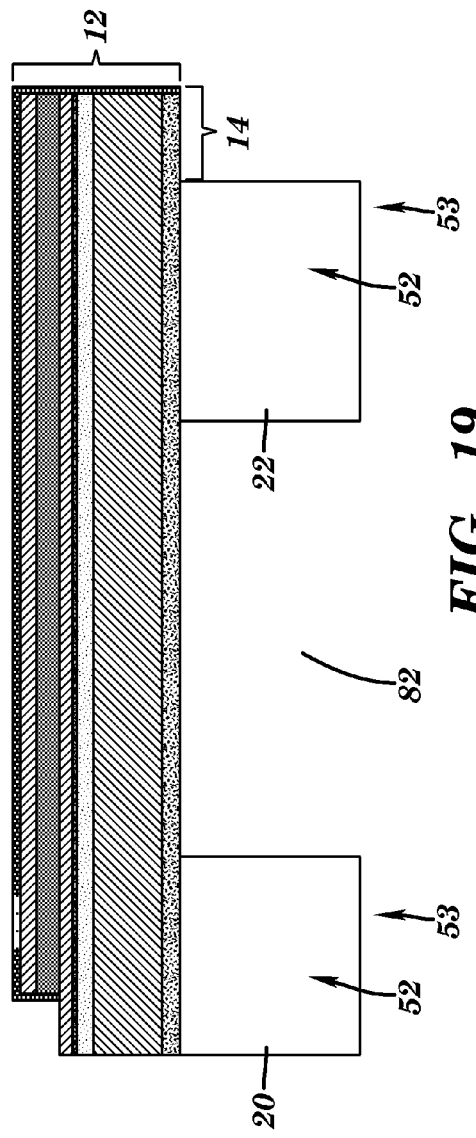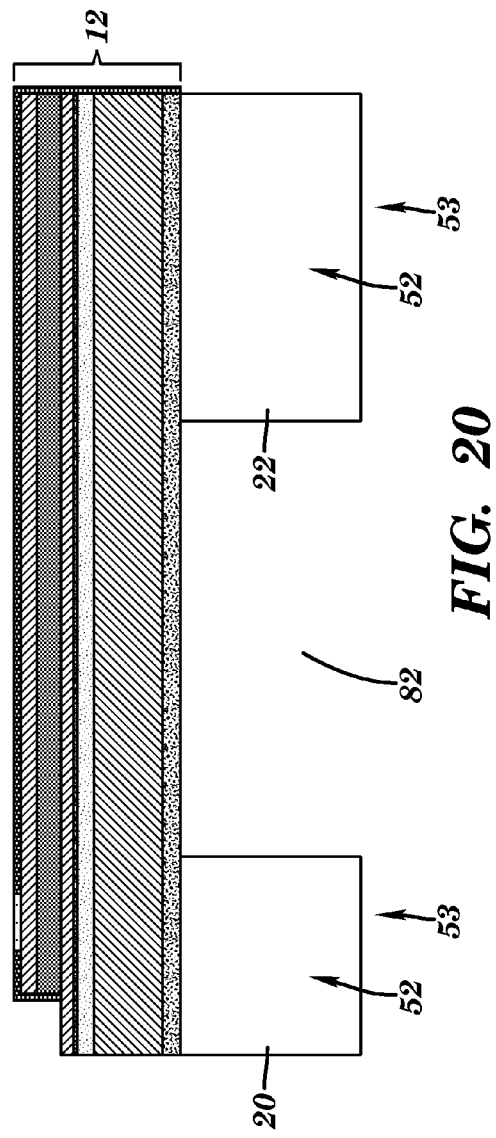

US 9,479,089 B2

PIEZOELECTRIC ENERGY HARVESTER DEVICE WITH A STOPPER STRUCTURE, SYSTEM, AND METHODS OF USE AND MAKING

This application claims the priority benefit of U.S. Provisional Patent Application Ser. No. 61/780,247, filed Mar. 13, 2013, which is hereby incorporated by reference in its entirety.

FIELD OF THE INVENTION

The present invention relates to a piezoelectric energy harvester device with a cantilever stopper structure, a system containing the device, and methods of using and making the device.

BACKGROUND OF THE INVENTION

Reduction in both size and power consumption of integrated circuits has led to the proliferation of wireless technology. For example, there is a wide variety of devices using low-power wireless circuits, including tablets; smartphones; cell phones; laptop computers; MP3 players; telephony headsets; headphones; routers; gaming controllers; mobile internet adaptors; wireless sensors; tire pressure sensor monitors; wearable sensors that communicate with tablets, PCs, and/or smartphones; devices for monitoring livestock; medical devices; human body monitoring devices; toys; etc. Each of these devices requires a standalone power supply to operate. Typically, power supplies for these devices are electrical batteries, often replaceable batteries.

Other wireless technologies of significant interest are wireless sensors and wireless sensor networks. In such networks, wireless sensors are distributed throughout a particular environment to form an ad hoc network that relays measurement data to a central hub. Particular environments include, for example, an automobile, an aircraft, a factory, or a building. A wireless sensor network may include several to tens of thousands of wireless sensor "nodes" that operate using multi-hop transmissions over distances. Each wireless node will generally include a sensor, wireless electronics, and a power source. These wireless sensor networks can be used to create an intelligent environment responding to environmental conditions.

A wireless sensor node, like the other wireless devices mentioned above, requires standalone electrical power to operate the electronics of that node. Conventional batteries, such as lithium-ion batteries, zinc-air batteries, lithium batteries, alkaline batteries, nickel-metal-hydride batteries, and nickel-cadmium batteries, could be used. However, it may be advantageous for wireless sensor nodes to function beyond the typical lifetime of such batteries. In addition, battery replacement can be burdensome, particularly in larger networks with many nodes.

Alternative standalone power supplies rely on scavenging (or "harvesting") energy from the ambient environment. For example, if a power-driven device is exposed to sufficient light, a suitable alternative standalone power supply may include photoelectric or solar cells. Alternatively, if the power-driven device is exposed to sufficient air movement, a suitable alternative standalone power supply may include a turbine or micro-turbine for harvesting power from the moving air. Other alternative standalone power supplies could also be based on temperature fluctuations, pressure fluctuations, or other environmental influences.

Some environments do not include sufficient amounts of light, air movement, temperature fluctuation, and/or pressure variation to power particular devices. Under such environments, the device may nevertheless be subjected to fairly predictable and/or constant vibrations, e.g., emanating from a structural support, which can be in the form of either a vibration at a constant frequency, or an impulse vibration containing a multitude of frequencies. In such cases, a scavenger (or harvester) that essentially converts movement (e.g., vibrational energy) into electrical energy can be used.

One particular type of vibrational energy harvester utilizes resonant beams that incorporate a piezoelectric material that generates electrical charge when strained during resonance of the beams caused by ambient vibrations (driving forces).

When a microelectromechanical ("MEMS") cantilever piezoelectric energy harvester is placed in an enclosed package (including packages that are under vacuum, packages that are overpressured, or packages that are at atmospheric pressure and may additionally be vented), there is potential for it, during deflection, to interact with the top or bottom of the package once the deflection of the package equals the package height. This is sometimes desirable as it can broaden the bandwidth of the frequency response of the cantilever. However, when the cantilever interacts with the top or bottom of the package, there is a risk of breakage of the cantilever. Prior art has addressed this issue by placing stopper features in the packaging to stabilize the interaction between the packaging and cantilever. However, this adds extra cost to the packaging manufacture and assembly, and requires precise alignment of the packaging to the energy harvester.

The present invention is directed to overcoming these and other deficiencies in the art.

SUMMARY OF THE INVENTION

One aspect of the present invention relates to an energy harvester device comprising an elongate resonator beam comprising a piezoelectric material, the resonator beam extending between first and second ends; a base connected to the resonator beam at the first end with the second end being freely extending from the base as a cantilever; a mass attached to the second end of the resonator beam; a package surrounding at least a portion of the second end of the resonator beam; and a stopper connected to the mass and/or the second end of the resonator beam, where the stopper is configured to prevent contact between the second end of the resonator beam and the package.

Another aspect of the present invention relates to a system comprising an electrically powered apparatus and the energy harvester device of the present invention electrically coupled to the apparatus.

A further aspect of the present invention relates to a method of powering an electrically powered apparatus. This method involves providing the system according to the present invention; subjecting the system to movement or vibrations to generate electrical energy from the piezoelectric material; and transferring the electrical energy from the piezoelectric material to the apparatus to provide power to the apparatus.

Another aspect of the present invention relates to a method of producing an energy harvester device. This method involves providing a silicon wafer having a first and second surface; depositing a first silicon dioxide layer on the first surface of the silicon wafer; depositing a cantilever material on the first silicon dioxide layer; depositing a second silicon dioxide layer on the cantilever material; depositing a piezoelectric stack on the second silicon dioxide layer; patterning the piezoelectric stack layer; patterning the second silicon dioxide layer, the cantilever material, and the first silicon dioxide layer; and etching the second surface of the silicon wafer to produce an energy harvester device. The energy harvester device comprises an elongate resonator beam extending between first and second ends; a base connected to the resonator beam at the first end with the second end being freely extending from the base as a cantilever; a mass attached to the second end of the resonator beam; and a spring tip at the second end of the resonator beam.

A further aspect of the present invention relates to a method of producing an energy harvester device. This method involves providing a silicon wafer having a first and second surface; depositing a first silicon dioxide layer on the first surface of the silicon wafer; depositing a cantilever material on the first silicon dioxide layer; depositing a second silicon dioxide layer on the cantilever material; depositing a piezoelectric stack on the second silicon dioxide layer; patterning the piezoelectric stack layer; patterning the second silicon dioxide layer, the cantilever material, and the first silicon dioxide layer; etching the second surface of the silicon wafer to define an energy harvester device. The energy harvester device comprises an elongate resonator beam extending between first and second ends; a base connected to the resonator beam at the first end with the second end being freely extending from the base as a cantilever; and a mass attached to the second end of the resonator beam. The method further involves depositing a stopper material and etching the stopper material to define a stopper at the second end of the elongate resonator beam.

The energy harvester device of the present invention incorporates a stopper feature to provide the function of stabilizing the cantilever/package interaction. The stopper feature can be made out of the materials used to make the cantilever itself and at the same time of cantilever fabrication, or out of complementary metal-oxide-semiconductor ("CMOS") compatible materials, thereby imparting little or no additional cost to the device fabrication. In addition, the present invention also avoids the need to align the device to features on the packaging, which is another cost savings.

BRIEF DESCRIPTION OF THE DRAWINGS

FIG. 1 is a side view of one embodiment of an energy harvester device of the present invention, which includes a resonator beam having a first and second end, the resonator beam comprising a piezoelectric material; a base connected to the resonator beam at the first end with the second end being freely extending from the base as a cantilever; and a mass attached to the second end of the resonator beam. The second end of the resonator beam comprises a stopper structure which extends beyond the edge of the mass.

FIG. 2 is a side view of one embodiment of an energy harvester device of the present invention, which includes a resonator beam having a first and second end, the resonator beam comprising a piezoelectric material; a base connected to the resonator beam at the first end with the second end being freely extending from the base as a cantilever; and a mass attached to the second end of the resonator beam. The second end of the resonator beam comprises a stopper structure which extends beyond the edge of the mass.

FIG. 8 is a side view of one embodiment of an energy harvester device of the present invention, which includes a resonator beam having a first and second end, the resonator beam comprising a piezoelectric material; a base connected to the resonator beam at the first end with the second end being freely extending from the base as a cantilever; and a mass attached to the second end of the resonator beam. The second end of the resonator beam comprises two stopper structures, one of which is located above the mass and the other of which is located beneath the mass.

FIGS. 9A and 9B illustrate the device at two different points in time during vibration of the resonator beam when the stopper located above the mass is in contact with the package to stabilize the motion of the cantilever and/or prevent contact of the resonator beam with the package (FIG. 9A) and when the stopper located beneath the mass is in contact with the package to stabilize the motion of the cantilever and/or prevent contact of the resonator beam with the package (FIG. 9B).

FIG. 12 is a side view of the layered material stack of FIG. 11, which has been patterned, according to one embodiment of the method of producing an energy harvester device of the present invention, to remove portions of the piezoelectric material layer and metal layer(s) from the layered material stack.

FIG. 13 is a side view of the layered material stack of FIG. 12, in which the first metal layer is patterned to remove a portion thereof from the layered material stack.

FIG. 17 is a side view of the layered material stack of FIG. 16, in which a metal bondpad layer has been deposited over the patterned third silicon dioxide layer, and portions of the piezoelectric stack and silicon wafer.

FIG. 18 is a side view of the layered material stack of FIG. 17, which has been patterned to remove portions of the metal bondpad layer.

FIG. 19 is a side view of the layered material stack of FIG. 18, in which portions of the silicon wafer have been etched to create a resonator beam, a base, and a mass, thus creating one embodiment of the energy harvester device of the present invention, which has a stopper structure that extends beyond the mass.

FIG. 20 is a side view of the layered material stack of FIG. 18, in which portions of the silicon wafer have been etched to create a resonator beam, a base, and a mass. According to the embodiment illustrated, the mass extends to the end, or nearly the end of the resonator beam.

DETAILED DESCRIPTION OF THE INVENTION

Figure 3A:
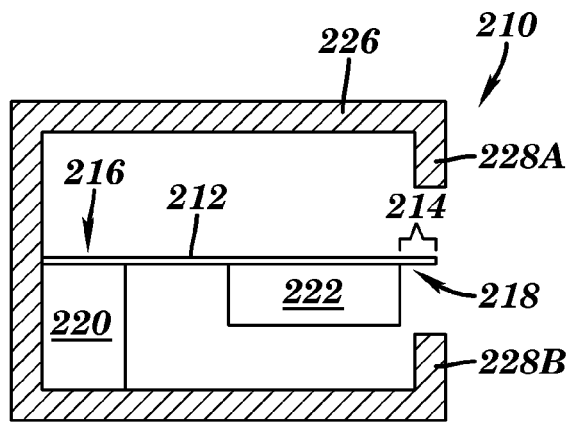
FIG. 3A is a side view of one embodiment of an energy harvester device of the present invention, which includes a resonator beam having a first and second end, the resonator beam comprising a piezoelectric material; a base connected to the resonator beam at the first end with the second end being freely extending from the base as a cantilever; a mass attached to the second end of the resonator beam; and a package surrounding at least a portion of the resonator beam. The second end of the resonator beam comprises a stopper structure which extends beyond the edge of the mass and is configured to prevent contact between the second end of the resonator beam and the package.

The present invention relates to a piezoelectric energy harvester device, a system comprising the piezoelectric energy harvester device, and methods of using and making the piezoelectric energy harvester device. The piezoelectric energy harvester device of the present invention incorporates a stopper feature to provide the function of stabilizing the cantilever/package interaction.

One aspect of the present invention relates to an energy harvester device comprising an elongate resonator beam comprising a piezoelectric material, the resonator beam extending between first and second ends; a base connected to the resonator beam at the first end with the second end being freely extending from the base as a cantilever; a mass attached to the second end of the resonator beam; a package surrounding at least a portion of the second end of the resonator beam; and a stopper connected to the mass and/or the second end of the resonator beam, where the stopper is configured to prevent contact between the second end of the resonator beam and the package. According to another embodiment, the stopper stabilizes motion of the resonator beam to prevent breakage.

FIG. 1 is a perspective view of one embodiment of the following parts of an energy harvester device of the present invention: an elongate resonator beam comprising a piezoelectric material, the resonator beam extending between first and second ends; a base connected to the resonator beam at the first end with the second end being freely extending from the base as a cantilever; a mass attached to the second end of the resonator beam; and a stopper connected to the mass and/or the second end of the resonator beam. Specifically, energy harvester device 10 includes resonator beam 12 comprising a piezoelectric material. Resonator beam 12 extends between first end 16 of resonator beam 12 and second end 18 of resonator beam 12. Base 20 is connected to resonator beam 12 at first end 16 with second end 18 being freely extending from base 20 as a cantilever. Energy harvester device 10 also includes mass 22 attached to second end 18 of resonator beam 12. Stopper 14 is formed as an extension of resonator beam 12 at second end 18, which extends beyond mass 22.

Energy harvester device 10 also includes one or more electrodes 24 in electrical contact with the piezoelectric material of resonator beam 12. According to one embodiment, electrodes 24 comprise a material selected from the group consisting of molybdenum and platinum, although other materials suitable for forming electrode structures may also be used. In addition, energy harvester device 10 may further include electrical harvesting circuitry in electrical connection with one or more electrodes 24 to harvest electrical energy from the piezoelectric material of resonator beam 12. As described in further detail below, the electrical harvesting circuitry can be electrically coupled to an electrically powered apparatus to provide power generated from the piezoelectric material and supplied to the apparatus.

Resonator beam 12 of energy harvester device 10 comprises a piezoelectric material. Piezoelectric materials are materials that when subjected to mechanical strain become electrically polarized. The degree of polarization is proportional to the applied strain. Piezoelectric materials are widely known and available in many forms including single crystal (e.g., quartz), piezoceramic (e.g., lead zirconate titanate or PZT), thin film (e.g., sputtered zinc oxide), screen printable thick-films based upon piezoceramic powders (see, e.g., Baudry, "Screen-printing Piezoelectric Devices," *Proc. 6th European Microelectronics Conference* (London, UK) pp. 456-63 (1987) and White & Turner, "Thick-film Sensors: Past, Present and Future," *Meas. Sci. Technol.* 8:1-20 (1997), which are hereby incorporated by reference in their entirety), and polymeric materials such as polyvinylidenefluoride ("PVDF") (see, e.g., Lovinger, "Ferroelectric Polymers," *Science* 220:1115-21 (1983), which is hereby incorporated by reference in its entirety).

Piezoelectric materials typically exhibit anisotropic characteristics. Thus, the properties of the material differ depending upon the direction of forces and orientation of the polarization and electrodes. The level of piezoelectric activity of a material is defined by a series of constants used in conjunction with the axes of notation. The piezoelectric strain constant, d, can be defined as $$d = \frac{\text{strain developed}}{\text{applied field}} \text{ m/V}$$

(Beeby et al., "Energy Harvesting Vibration Sources for Microsystems Applications," *Meas. Sci. Technol.* 17:R175-R195 (2006), which is hereby incorporated by reference in its entirety).

In the energy harvester device of the present invention, resonator beam 12 has second end 18, which is freely extending from base 20 as a cantilever. A cantilever structure comprising piezoelectric material is designed to operate in a bending mode thereby straining the piezoelectric material and generating a charge from the d effect (Beeby et al., "Energy Harvesting Vibration Sources for Microsystems Applications," *Meas. Sci. Technol.* 17:R175-R195 (2006), which is hereby incorporated by reference in its entirety). A cantilever provides low resonant frequencies, reduced further by the presence of mass 22 attached at second end 18 of resonator beam 12.

Resonant frequencies of resonator beam 12 of energy harvester device 10 of the present invention in operation may include frequencies of about 50 Hz to about 4,000 Hz, about 100 Hz to about 3,000 Hz, about 100 Hz to about 2,000 Hz, or about 100 Hz to about 1,000 Hz.

According to one embodiment, resonator beam 12 comprises a laminate formed of a plurality of layers, at least one of which comprises a piezoelectric material. Suitable piezoelectric materials include, without limitation, aluminum nitride, zinc oxide, PVDF, and lead zirconate titinate based compounds. Other non-piezoelectric materials may also be used as layers along with a layer of piezoelectric material. Non-limiting examples of other layers include those described below with respect to the layered material stack (50) of FIG. 11.

Resonator beam 12 may have sidewalls that take on a variety of shapes and configurations to help tuning of resonator beam 12 and to provide structural support. According to one embodiment, resonator beam 12 has sidewalls which are continuously curved within the plane of resonator beam 12, as described in U.S. Provisional Patent Application Ser. No. 61/780,203, which is hereby incorporated by reference in its entirety.

Energy harvester device 10 of the present invention includes mass 22 at second end 18 of resonator beam 12. Mass 22 is provided to lower the frequency of resonator beam 12 and also to increase the power output of resonator beam 12 (i.e., generated by the piezoelectric material). Mass 22 may be constructed of a single material or multiple materials (e.g., layers of materials). According to one embodiment, mass 22 is formed of silicon wafer material. Other suitable materials include, without limitation, copper, gold, and nickel deposited by electroplating or thermal evaporation.

In one embodiment, a single mass 22 is provided per resonator beam 12. However, more than one mass 22 may also be attached to resonator beam 12. In other embodiments, mass 22 is provided, for example, at differing locations along resonator beam 12.

As those skilled in the art will readily appreciate, resonator beam 12 can be tuned by varying any one or more of a number of parameters, such as the cross-sectional shape of resonator beam 12, cross-sectional dimensions of resonator beam 12, the length of resonator beam 12, the mass of mass 22, the location of mass 22 on resonator beam 12, and the materials used to make resonator beam 12.

In operation, one or more electrodes 24 harvest charge from the piezoelectric material of resonator beam 12 as resonator beam 12 is subject to movement. Accordingly, electrodes 24 are in electrical connection with the piezoelectric material of resonator beam 12.

Electrical energy collected from the piezoelectric material of resonator beam 12 is then communicated to electrical harvesting circuitry also formed on energy harvester device 10 at or near electrodes 24.

FIG. 2 illustrates an alternative embodiment of an energy harvester device of the present invention. Specifically, energy harvester device 110 includes resonator beam 112 comprising a piezoelectric material. Resonator beam 112 extends between first end 116 of resonator beam 112 and second end 118 of resonator beam 112. Base 120 is connected to resonator beam 112 at first end 116 with second end 118 being freely extending from base 120 as a cantilever. Energy harvester device 110 also includes mass 122 attached to second end 118 of resonator beam 112. Stopper 114 is formed as a separate structure at second end 118 on resonator beam 112, and extends beyond mass 122.

Figure 3B:
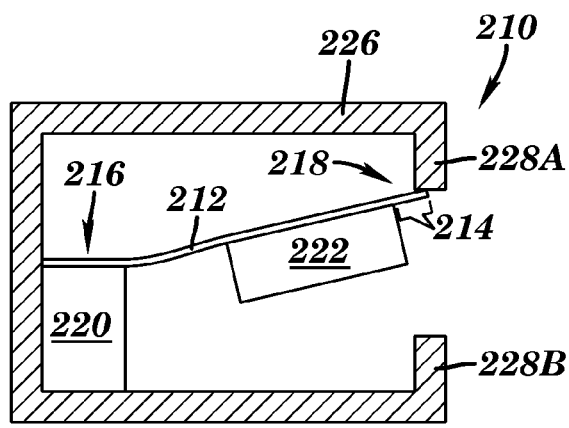
FIGS. 3B and 3C illustrate the device of FIG. 3A at two different points in time during vibration of the resonator beam when the stopper is in contact with the package to stabilize the motion of the cantilever and/or prevent contact of the resonator beam with the package.
Figure 3C:
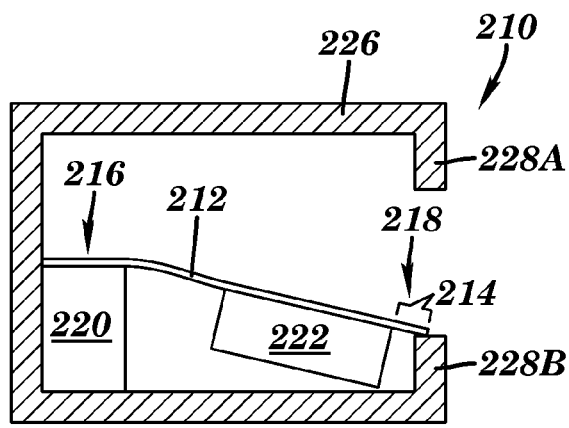

As illustrated in FIG. 3A, the energy harvester device of the present invention may be formed in an integrated, self-packaged unit. In particular, package 226 is shown to surround the cantilever structure (i.e., resonator beam 212, stopper 214, mass 222, and base 220) so that it encloses (at least partially) the cantilever structure. FIGS. 3B and 3C illustrate the interaction of the cantilever structure (specifically, stopper 214) with package 226. Specifically, in FIG. 3B, second end 218 of resonator beam 212 is bent upwards during vibration of resonator beam 212 and stopper 214 comes into contact with lip 228A of package 226 to prevent any contact of resonator beam 212 with any other portions of package 226 and to stabilize the motion of resonator beam 212. In FIG. 3C, second end 218 of resonator beam 212 is bent downwards during vibration of resonator beam 212 and stopper 214 comes into contact with lip 228B of package 226 to prevent any contact of resonator beam 212 (and mass 222) with any other portions of package 226 and to stabilize the motion of resonator beam 212. Meanwhile, first end 216 of resonator beam 212 remains fixed to base 220.

As illustrated in FIGS. 3A-3B, base 220 is illustrated as a separate structure from package 226. However, according to one embodiment, the base may be formed integral with the package such that the base is part of the package and not a separate structure.

Figure 4A:
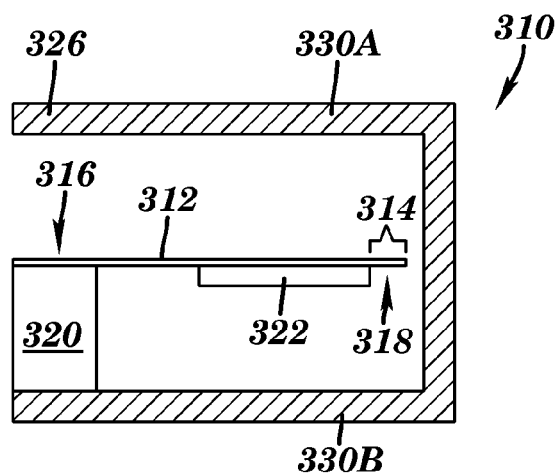
FIG. 4A is a side view of one embodiment of an energy harvester device of the present invention, which includes a resonator beam having a first and second end, the resonator beam comprising a piezoelectric material; a base connected to the resonator beam at the first end with the second end being freely extending from the base as a cantilever; a mass attached to the second end of the resonator beam; and a package surrounding the resonator beam. The second end of the resonator beam comprises a stopper structure which extends beyond the edge of the mass and is configured to prevent contact between the second end of the resonator beam and the package.
Figure 4B:
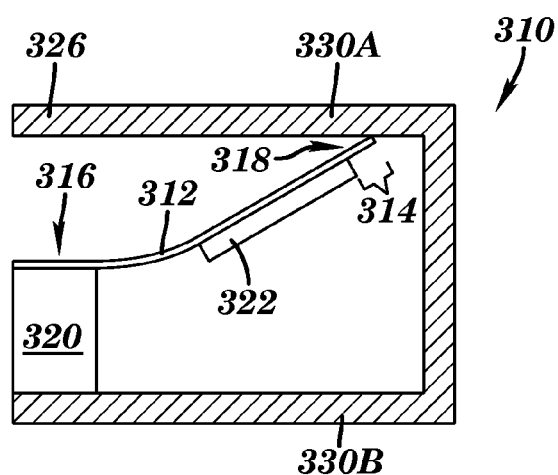
FIGS. 4B and 4C illustrate the device of FIG. 4A at two different points in time during vibration of the resonator beam when the stopper is in contact with the package to stabilize the motion of the cantilever and/or prevent contact of the resonator beam with the package.
Figure 4C:
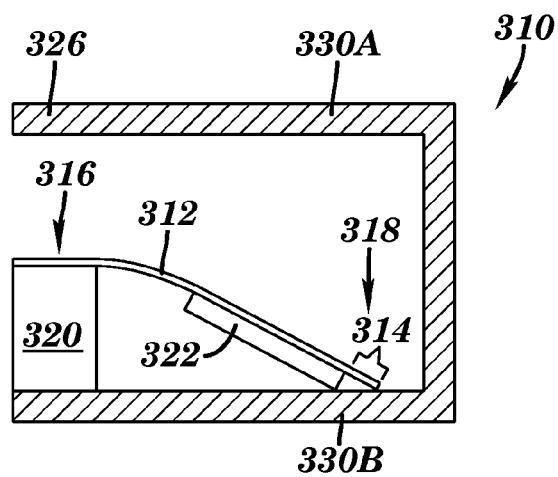

Other packaging of the energy harvester device of the present invention may also be used as illustrated in FIGS. 4-6, and as further described below. For example, as illustrated in FIG. 4A, package 326 is shown to surround the cantilever structure (i.e., resonator beam 312, stopper 314, mass 322, and base 320) so that it encloses the cantilever structure at second end 318 of resonator beam 312, but leaves an opening near first end 316 of resonator beam 312 and base 320. FIGS. 4B and 4C illustrate the interaction of the cantilever structure (specifically, stopper 314) with package 326. Specifically, in FIG. 4B, second end 318 of resonator beam 312 is bent upwards during vibration of resonator beam 312, and stopper 314 comes into contact with wall 330A of package 326 to prevent any contact of resonator beam 312 with any other portions of package 326 and to stabilize the motion of resonator beam 312. In FIG. 4C, second end 318 of resonator beam 312 is bent downwards during vibration of resonator beam 312, and stopper 314 comes into contact with wall 330B of package 326 to prevent any contact of resonator beam 312 (and mass 322) with any other portions of package 326 and to stabilize the motion of resonator beam 312. Meanwhile, first end 316 of resonator beam 312 remains fixed to base 320.

Figure 5A:
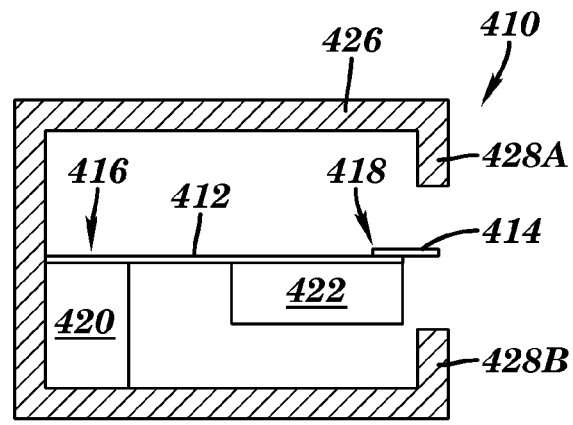
FIG. 5A is a side view of one embodiment of an energy harvester device of the present invention, which includes a resonator beam having a first and second end, the resonator beam comprising a piezoelectric material; a base connected to the resonator beam at the first end with the second end being freely extending from the base as a cantilever; a mass attached to the second end of the resonator beam; and a package surrounding at least a portion of the resonator beam. The second end of the resonator beam comprises a stopper structure which extends beyond the edge of the mass and is configured to prevent contact between the second end of the resonator beam and the package.
Figure 5B:
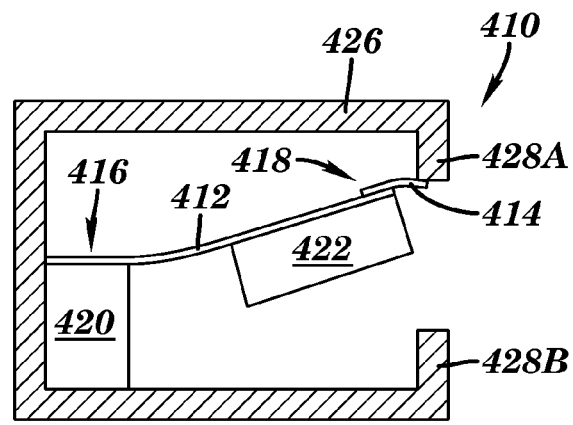
FIGS. 5B and 5C illustrate the device of FIG. 5A at two different points in time during vibration of the resonator beam when the stopper is in contact with the package to stabilize the motion of the cantilever and/or prevent contact of the resonator beam with the package.
Figure 5C:
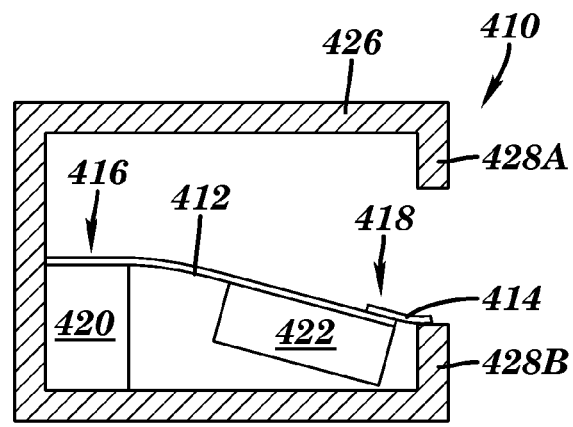

Another embodiment of the energy harvester device of the present invention is illustrated in FIG. 5A. In particular, package 426 is shown to surround the cantilever structure (i.e., resonator beam 412, stopper 414, mass 422, and base 420) so that it encloses (at least partially) the cantilever structure. FIGS. 5B and 5C illustrate the interaction of the cantilever structure (specifically, stopper 414) with package 426. Specifically, in FIG. 5B, second end 418 of resonator beam 412 is bent upwards during vibration of resonator beam 412 and stopper 414 comes into contact with lip 428A of package 426 to prevent any contact of resonator beam 412 with any other portions of package 426 and to stabilize the motion of resonator beam 412. In FIG. 5C, second end 418 of resonator beam 412 is bent downwards during vibration of resonator beam 412 and stopper 414 comes into contact with lip 428B of package 426 to prevent any contact of resonator beam 412 (and mass 422) with any other portions of package 426 and to stabilize the motion of resonator beam 412. Meanwhile, first end 416 of resonator beam 412 remains fixed to base 420.

Figure 6A:
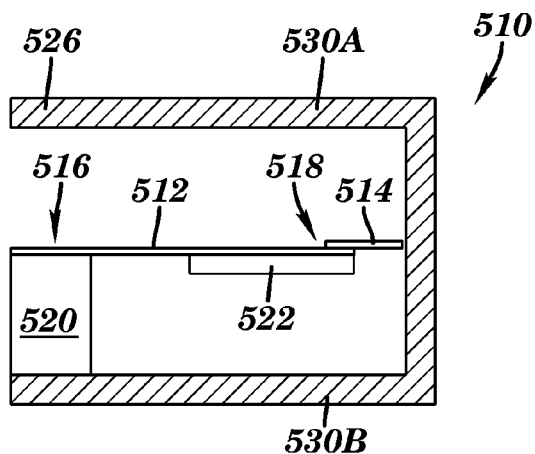
FIG. 6A is a side view of one embodiment of an energy harvester device of the present invention, which includes a resonator beam having a first and second end, the resonator beam comprising a piezoelectric material; a base connected to the resonator beam at the first end with the second end being freely extending from the base as a cantilever; a mass attached to the second end of the resonator beam; and a package surrounding the resonator beam. The second end of the resonator beam comprises a stopper structure which extends beyond the edge of the mass and is configured to prevent contact between the second end of the resonator beam and the package.
Figure 6B:
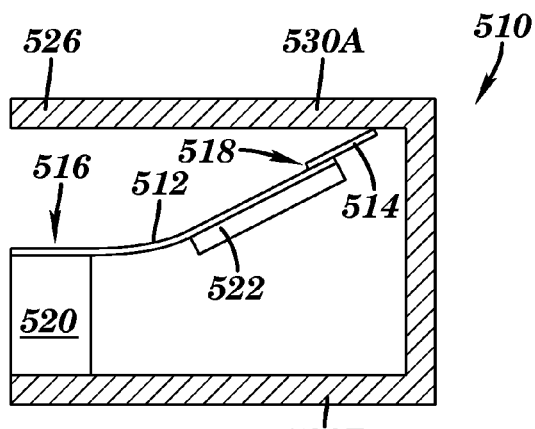
FIGS. 6B and 6C illustrate the device of FIG. 6A at two different points in time during vibration of the resonator beam when the stopper is in contact with the package to stabilize the motion of the cantilever and/or prevent contact of the resonator beam with the package.
Figure 6C:
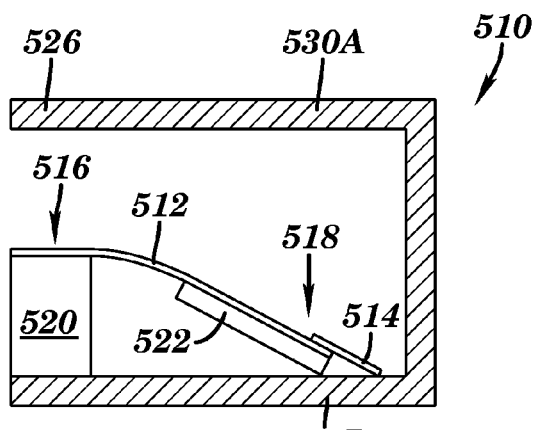

A further embodiment of the energy harvester device of the present invention is illustrated in FIG. 6A. In particular, package 526 is shown to surround the cantilever structure (i.e., resonator beam 512, stopper 514, mass 522, and base 520) so that it encloses (at least partially) the cantilever structure. FIGS. 6B and 6C illustrate the interaction of the cantilever structure (specifically, stopper 514) with package 526. Specifically, in FIG. 6B, second end 518 of resonator beam 512 is bent upwards during vibration of resonator beam 512 and stopper 514 comes into contact with wall 530A of package 526 to prevent any contact of resonator beam 512 with any other portions of package 526 and to stabilize the motion of resonator beam 512. In FIG. 6C, second end 518 of resonator beam 512 is bent downwards during vibration of resonator beam 512 and stopper 514 comes into contact with wall 530B of package 526 to prevent any contact of resonator beam 512 (and mass 522) with any other portions of package 526 and to stabilize the motion of resonator beam 512. Meanwhile, first end 516 of resonator beam 512 remains fixed to base 520.

Figure 7A:
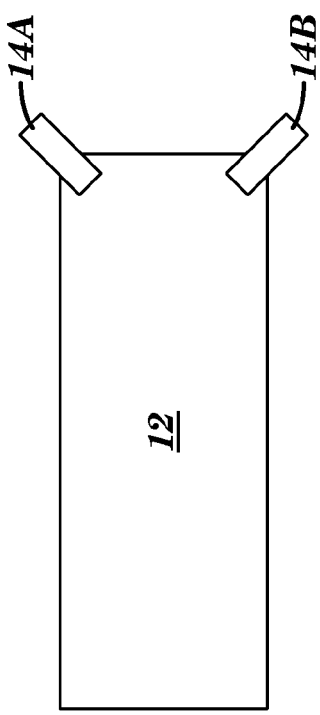
FIGS. 7A-L are plan views of various embodiments of a resonator beam comprising one or more stopper structures, which form a part of the energy harvester device of the present invention.
Figure 7B:
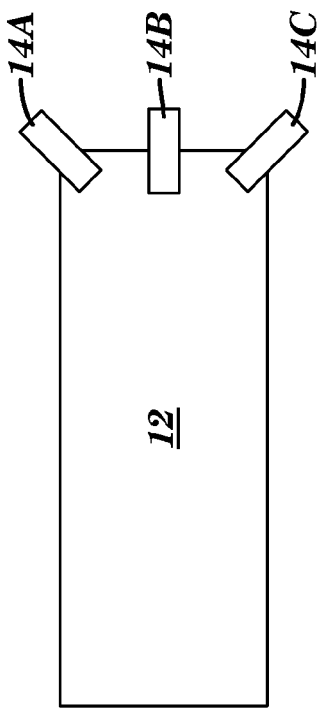
Figure 7C:
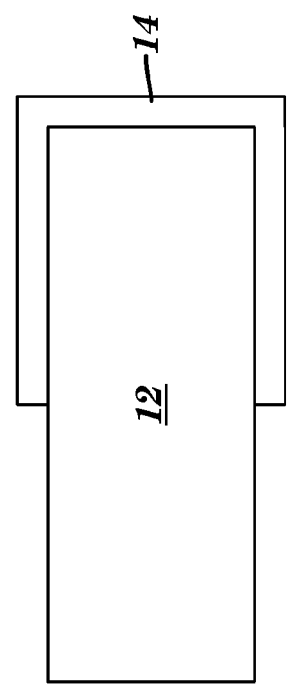
Figure 7D:
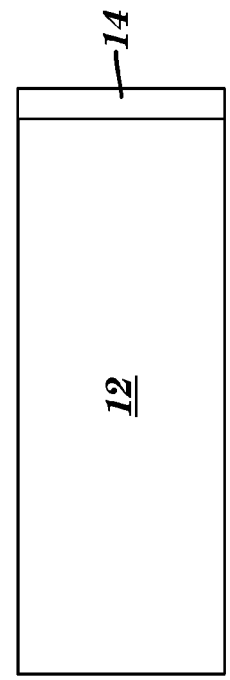
Figure 7F:
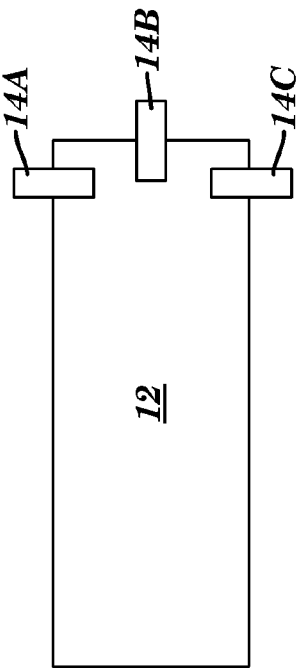
Figure 7H:
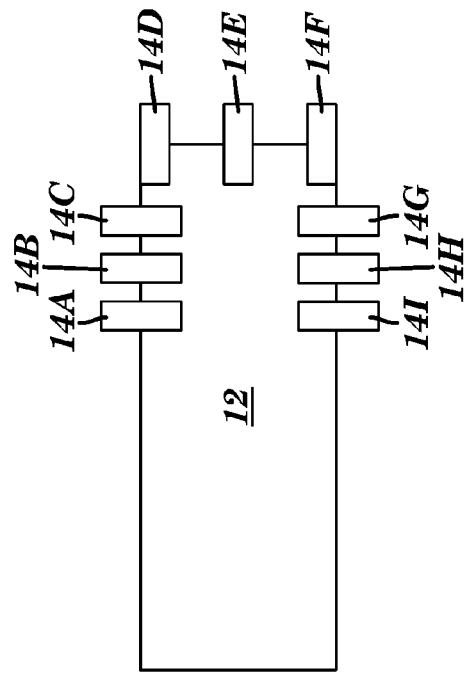
Figure 7E:
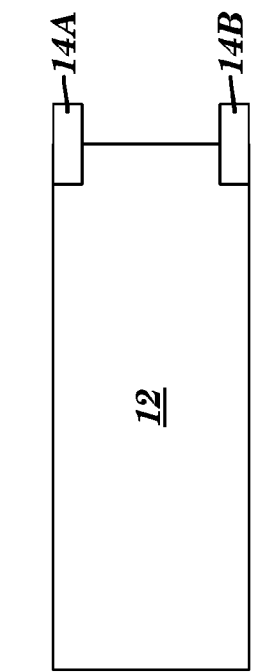
Figure 7G:
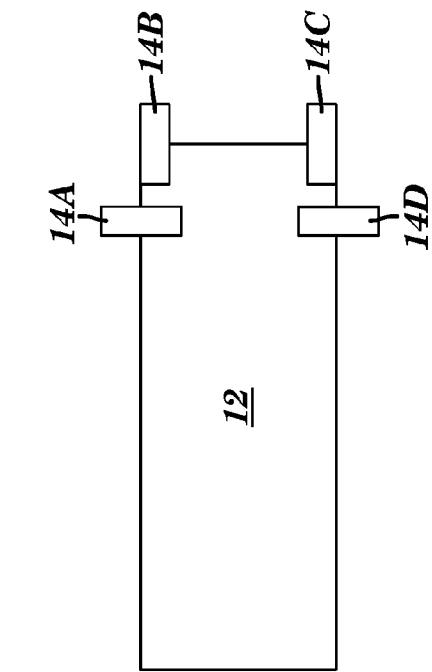
Figure 7J:
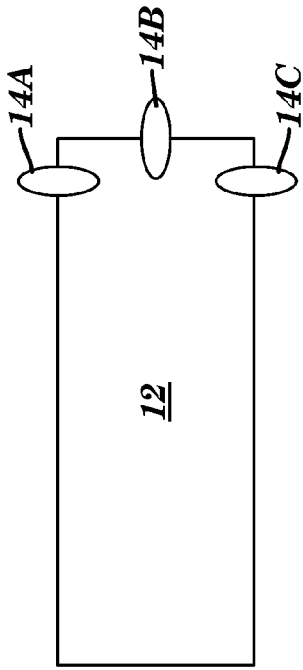
Figure 7L:
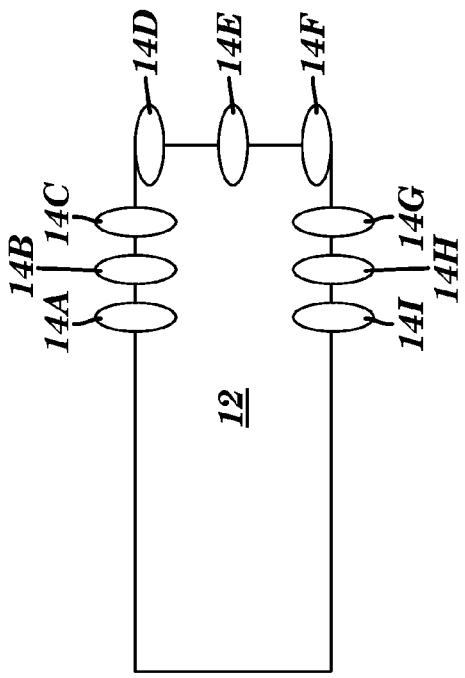
Figure 7I:
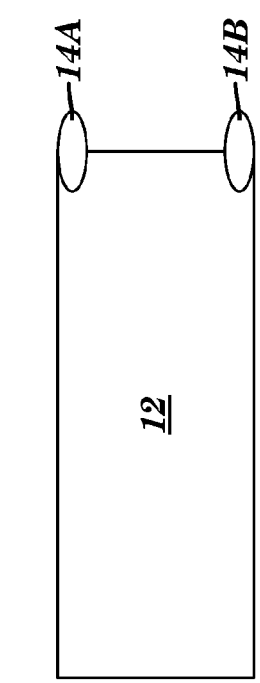
Figure 7K:
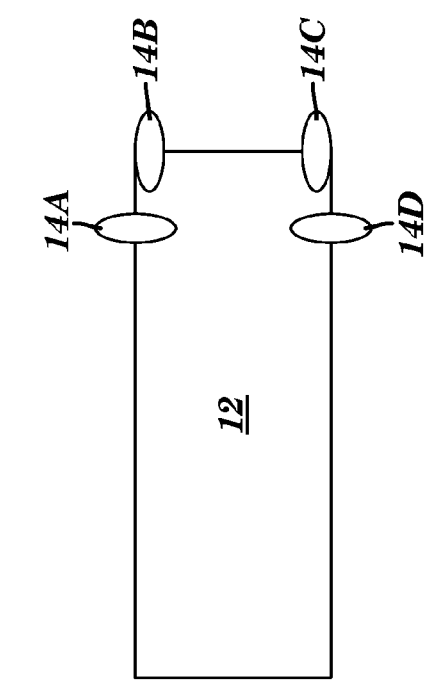

The stopper structure of the resonator beam of the energy harvester device of the present invention may take on a variety of designs. Several non-limiting examples of the stopper structure formed integral with or on the resonator beam are illustrated in FIGS. 7A-7L. In FIG. 7A, resonator beam 12 comprises two stoppers 14A and 14B which emanate from corners of resonator beam 12. In FIG. 7B, three stoppers 14A, 14B, and 14C are used on resonator beam 12. In FIG. 7C, stopper 14 is formed along three different edges of resonator beam 12. In FIG. 7D, stopper 14 is formed along one edge of resonator beam 12. In FIG. 7E, stoppers 14A and 14B are positioned at two corners of resonator beam 12. FIG. 7F shows three stoppers 14A, 14B, and 14C, which are formed as individual structures protruding from three different sides of resonator beam 12. In FIG. 7G, there are four stoppers 14A, 14B, 14C, and 14D. A first side of resonator beam 12 includes two stoppers 14B and 14C, which two other sides each contain a single stopper (14A and 14D). FIG. 7H employees several stoppers, including stoppers 14A, 14B, 14C, 14D, 14E, 14F, 14G, 14H, and 14I, which are formed in sets of three stoppers along three different sides of resonator beam 12. FIGS. 7I, 7J, 7K, and 7L illustrate resonator beams 12 that have a structure similar to those illustrated in FIGS. 7E, 7F, 7G, and 7H, respectively, except that the stoppers 14 in FIGS. 7I, 7J, 7K, and 7L have a rounded shape compared to the square shape of the stoppers 14 in FIGS. 7E, 7F, 7G, and 7H.

When formed as a separate structure from the resonator beam, the stopper may be constructed of a material selected from the group consisting of metal, photoresist, polyimide, $SiO_2$, and other complementary metal-oxide-semiconductor compatible materials, or any combination thereof.

According to one embodiment, the stopper of the energy harvester device of the present invention is flexible. Thus, for example, with reference to FIGS. 6B-6C, stopper 514, when it comes into contact with wall 530A and 530B during vibration, flexes to help stabilize resonator beam 512.

The stopper structure may be formed on the resonator beam of the energy harvester device of the present invention, and/or on the mass. Thus, as illustrated in FIG. 8, energy harvester device 610 may include two stoppers 614A and 614B. Stopper 614A is formed on top of resonator beam 612 and first second end 618, and stopper 614B is formed on the underside of mass 622. Resonator beam 612 is attached at first end 616 to base 620.

Figure 9A:
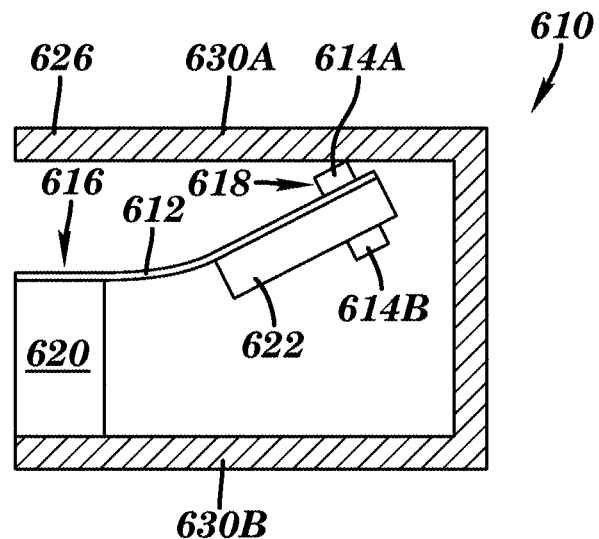
FIGS. 9A-9B are side views of one embodiment of an energy harvester device of the present invention, which includes a resonator beam having a first and second end, the resonator beam comprising a piezoelectric material; a base connected to the resonator beam at the first end with the second end being freely extending from the base as a cantilever; a mass attached to the second end of the resonator beam; and a package surrounding at least a portion of the resonator beam. The second end of the resonator beam comprises two stopper structures, one of which is located above the mass and the other of which is located beneath the mass.
Figure 9B:
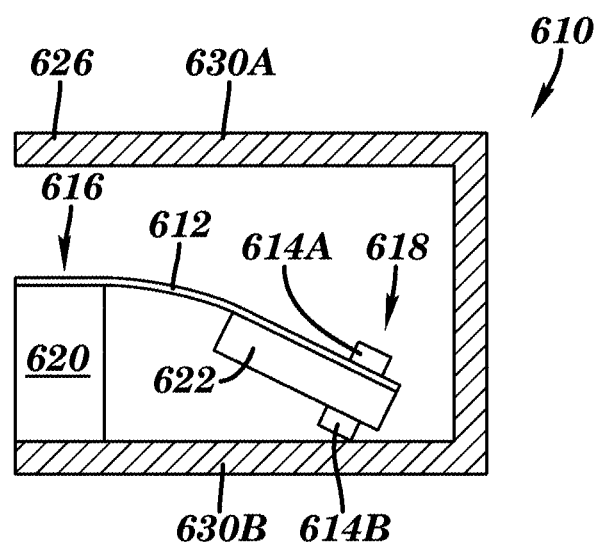

FIGS. 9A and 9B illustrated the cantilever structure of FIG. 8 partially enclosed in package 626. In FIG. 9A, second end 618 of resonator beam 612 is bent upwards during vibration of resonator beam 612 and stopper 614A comes into contact with wall 630A of package 626 to prevent any contact of resonator beam 612 with any other portions of package 626 and to stabilize the motion of resonator beam 612. In FIG. 9B, second end 618 of resonator beam 612 is bent downwards during vibration of resonator beam 612 and stopper 614B comes into contact with wall 630B of package 626 to prevent any contact of resonator beam 612 (and mass 622) with any other portions of package 626 and to stabilize the motion of resonator beam 612. Meanwhile, first end 616 of resonator beam 612 remains fixed to base 620. Stoppers 614A and 614B are optimally placed on energy harvester device 610 so as to stabilize the motion of resonator beam 612.

Another aspect of the present invention relates to a system comprising an electrically powered apparatus and the energy harvester device of the present invention electrically coupled to the electrically powered apparatus.

Figure 10:
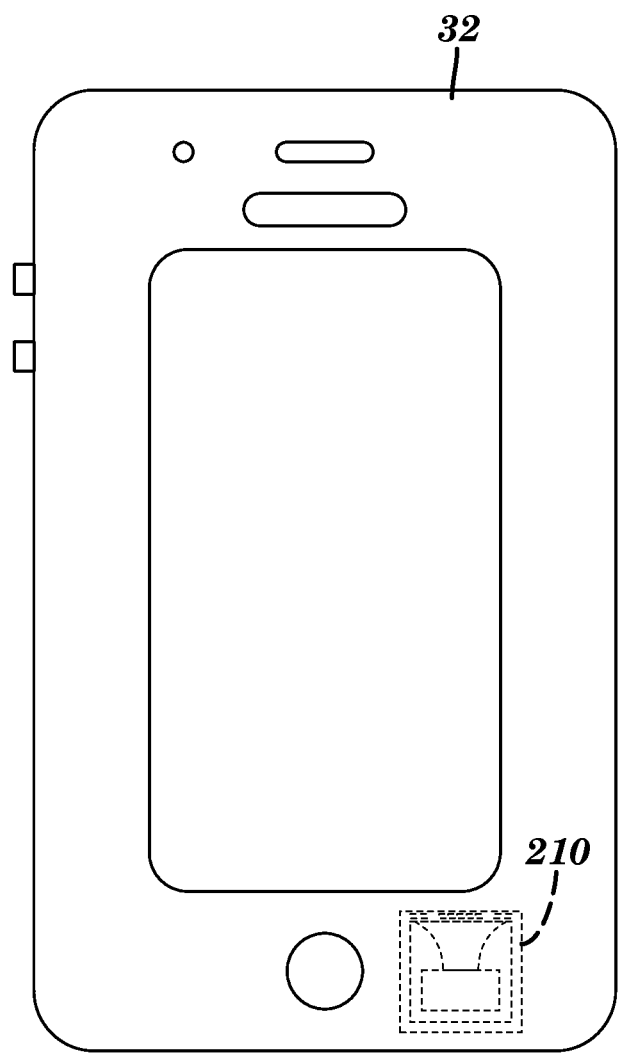
FIG. 10 illustrates one embodiment of a system of the present invention which includes an electrically powered smart phone containing an energy harvester device of the present invention which is electrically coupled to the smart phone to provide electrical energy to power the smart phone.

Turning now to FIG. 10, electrically powered apparatus (smartphone) 32 is shown to contain (within its exterior housing) energy harvester device 10. According to this embodiment, energy harvester device 10 provides a stand-alone source of energy to power smartphone 32, which is used in place of or in conjunction with another standalone energy source (e.g., a battery). In an alternative embodiment, the electrically powered apparatus is, e.g., a wearable device, such as a wrist watch-type device or necklace that electronically communicates with a tablet, PC, and/or smartphone.

Other systems of the present invention that include an electrically powered apparatus and the energy harvester device of the present invention include, without limitation, a laptop computer; a tablet computer; a cell phone; an e-reader; an MP3 player; a telephony headset; headphones; a router; a gaming device; a gaming controller; a mobile internet adapter; a camera; wireless sensors; wearable sensors that communicate with tablets, PCs, and/or smartphones; wireless sensor motes (for networks monitoring industrial, rail, buildings, agriculture, etc.); tire pressure sensor monitors; electronic displays (e.g., on power tools); agriculture devices for monitoring livestock; medical devices; human body monitoring devices; and toys.

For example, according to one embodiment, the system of the present invention is a wireless sensor device containing a sensor to monitor, e.g., any one or more various environmental properties (temperature, humidity, light, sound, vibration, wind, movement, etc.). The energy harvester device of the present invention is coupled to the sensor to provide power to the sensor.

According to one example, the system of the present invention is a tire-pressure monitoring system containing a sensor to monitor tire pressure. The energy harvester device of the present invention is coupled to the sensor to provide power. Such a system may be formed as a small device mounted, e.g., on a wheel or tire of an automobile.

According to another example, the system of the present invention is a humidity sensor in communication with electronic controls of a household or commercial clothes drier. The energy harvester device of the present invention is coupled to the sensor to provide power. Such a system may be formed as a small device mounted, e.g., on the inside of a clothes drier to monitor the dryness of clothes based on humidity levels in the clothes drier. Alternatively, the device is not mounted on the inside of a clothes drier, but is, e.g., a device that can be tossed into the drier with clothes (e.g., a ball). The sensor could then communicate with the electronic controls of the clothes drier to determine, e.g., the end of a cycle.

A further aspect of the present invention relates to a method of powering an electrically powered apparatus. This method involves providing the system of the present invention; subjecting the system to movement or vibrations to generate electrical energy from the piezoelectric material; and transferring the electrical energy from the piezoelectric material to the apparatus to provide power to the apparatus.

Another aspect of the present invention relates to a method of producing an energy harvester device. This method involves providing a silicon wafer having a first and second surface; depositing a first silicon dioxide ($SiO_2$) layer on the first surface of the silicon wafer; depositing a cantilever material on the first silicon dioxide layer; depositing a second silicon dioxide layer on the cantilever material; depositing a piezoelectric stack layer on the second silicon dioxide layer; patterning the piezoelectric stack layer; patterning the second silicon dioxide layer, the cantilever material, and the first silicon dioxide layer; and etching the second surface of the silicon wafer to produce the energy harvester device. The energy harvester device comprises an elongate resonator beam extending between first and second ends; a base connected to the resonator beam at the first end with the second end being freely extending from the base as a cantilever; a mass attached to the second end of the resonator beam; and a spring tip at the second end of the resonator beam.

According to one embodiment, the method of the present invention may further involve depositing a third silicon dioxide layer over the patterned piezoelectric stack layer and the patterned second silicon dioxide layer, cantilever material, and first silicon dioxide layer and patterning the third silicon dioxide layer. According to another embodiment, the method of the present invention may further involve depositing a metal bondpad layer over the patterned third silicon dioxide layer and patterning the metal bondpad layer.

Figure 11:
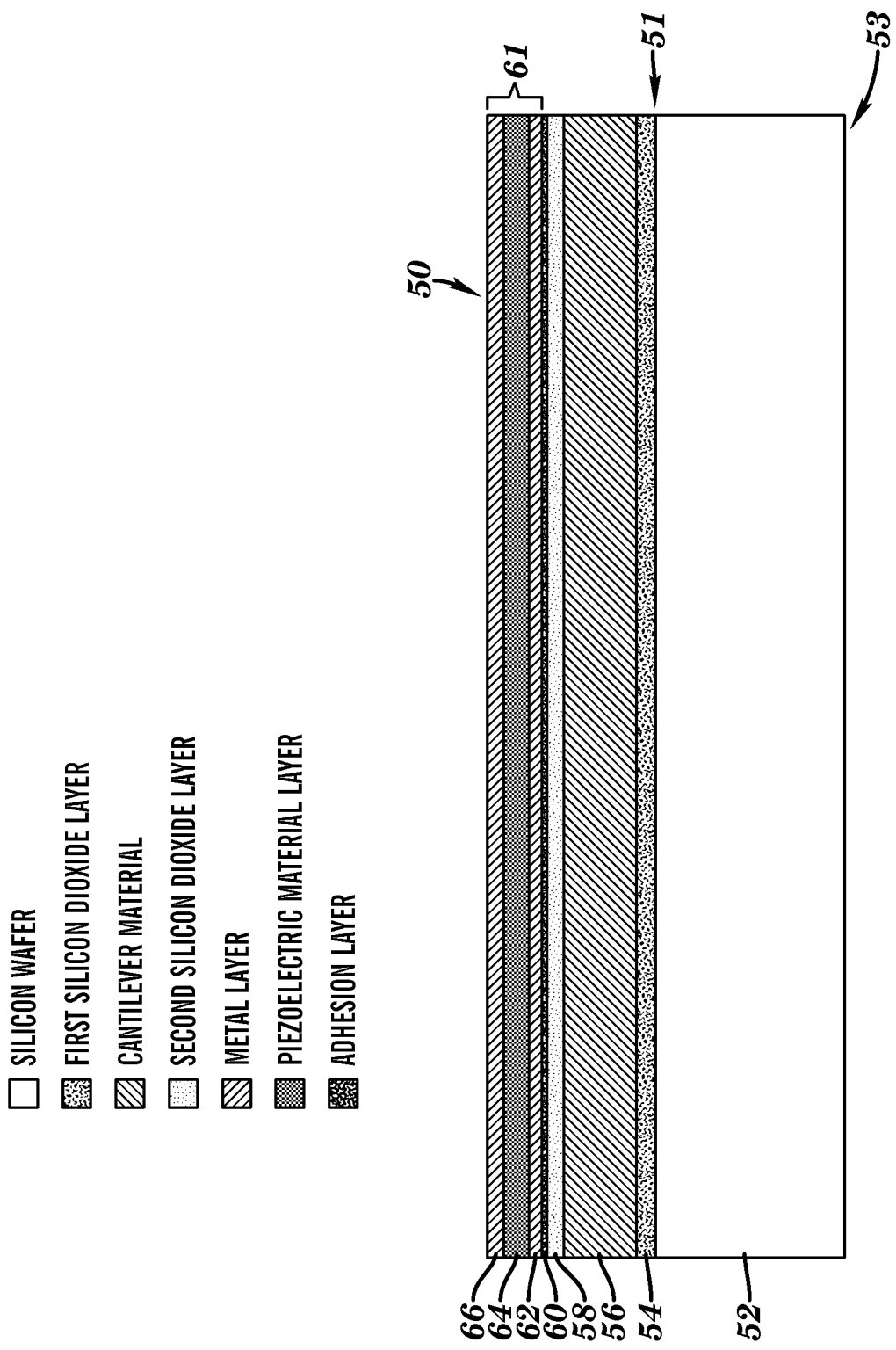
FIG. 11 is a side view of a layered material stack for producing one embodiment of an energy harvester device of the present invention. The layered material stack includes a silicon wafer, a first silicon dioxide layer, a cantilever material, a second silicon dioxide layer, an optional adhesion layer, a first metal layer, a piezoelectric material layer, and a second metal layer.

With reference now to FIG. 11, one embodiment of the method of producing the energy harvester device of the present invention involves forming layered material stack 50, which is a stack of layered materials that is patterned to form an energy harvester device as described herein. Layered material stack 50 includes the following layered materials: silicon wafer 52 (which has first surface 51 and second surface 53), first silicon dioxide layer 54, cantilever material 56, second silicon dioxide layer 58, adhesion layer 60 (which is optional), and piezoelectric stack layer 61 (comprising first metal layer 62, piezoelectric material layer 64, and second metal layer 66).

As illustrated in FIG. 11, the method of forming the energy harvester device of the present invention involves forming layered material stack 50 by providing silicon wafer 52 having first surface 51 and second surface 53, depositing first silicon dioxide layer 54 on first surface 51 of silicon wafer 52, depositing cantilever material 56 on first silicon dioxide layer 54, depositing second silicon dioxide layer 58 on cantilever material 56, depositing optional adhesion layer 60 on second silicon dioxide layer 58, and depositing piezoelectric stack layer 61 on second silicon dioxide layer 58.

Silicon wafer 52 is, according to one embodiment, a single crystal double-sided polished silicon wafer. In one embodiment, silicon wafer 52 has a thickness of about 400 µm to about 1,000 µm, about 500 µm to about 900 µm, about 600 µm to about 800 µm, or about 700 µm. In one specific example, silicon wafer 52 is a double-sided polished silicon wafer having a thickness of approximately 725 µm (+/−15 µm) (i.e., the standard thickness for 8 inch wafers). Alternatively, in place of silicon wafer 52, the method of the present invention may begin with a deposited layer of silicon dioxide upon which the subsequent layers of layered material stack 50 are formed.

First silicon dioxide layer 54 is, according to one embodiment, a thermal oxide layer. Silicon dioxide layer 54 provides an etch stop for the backside etch stop that releases cantilever material 56 and, when the mass is made of silicon, also defines the mass. In one embodiment, first silicon dioxide layer 54 has a thickness of about 0.25 µm to about 2 µm. Deposition of first silicon dioxide layer 54 onto silicon wafer 52 can be carried out by methods known in the art. For example, silicon dioxide may be thermally grown and then deposited on the silicon wafer. In one particular example, one (1) µm (+/−0.05 µm) of thermally grown $SiO_2$ is deposited onto silicon wafer 52 to form silicon dioxide layer 54.

Cantilever material 56 may be any suitable material such as silicon, polySi, metal (e.g., Cu or Ni), or other metal oxide semiconductor (CMOS) compatible material, or a high temperature polymer such as polyimide. In one embodiment, cantilever material 56 is deposited on first silicon dioxide layer 54 by chemical vapor deposition at a thickness range of about 10 µm to about 200 µm, about 10 µm to about 75 µm, or about 10 µm to about 50 µm. Following deposition, it may be desirable to smooth the surface of cantilever material 56, e.g., by chemical mechanical polish.

Second silicon dioxide layer 58 is, according to one embodiment, a high temperature oxide layer. This layer provides a surface upon which piezoelectric stack layer 61 can adhere well to, as well as an etch stop for patterning a bottom electrode of piezoelectric stack layer 61. In one embodiment, second silicon dioxide layer 58 is deposited onto cantilever material 56 by chemical vapor deposition at a thickness of about 1 µm.

Piezoelectric stack layer 61 is deposited onto second silicon dioxide layer 58 to form a metal/piezoelectric material/metal layer. According to one embodiment, piezoelectric stack layer 61 has a thickness of about 0.5 µm to about 6 µm, or about 2 µm to about 5 µm in thickness. First metal layer 62 and second metal layer 66 may be formed of any suitable metals that adequately function as an electrode. According to one embodiment, these layers are formed of the same material, such as molybdenum or platinum. However, both layers need not be formed of the same material. Piezoelectric material layer 64 is formed of any suitable piezoelectric material, as discussed above. According to one embodiment, this layer is formed of aluminum nitride (AlN).

Deposition of piezoelectric stack layer 61 may be carried out with thin adhesion layer 60 underneath as is standard in the art. Suitable adhesion layers 60 may include materials such as titanium, AlN, Al:Cu, or Al at a layer thickness of about 0.02 µm to about 0.05 µm.

One embodiment of the method of making an energy harvester device of the present invention proceeds as illustrated in FIGS. 12-19. First, as shown in FIGS. 12-13, piezoelectric stack layer 61 is patterned. In particular, portions (e.g., portions 68 and 70) of piezoelectric material layer 64 and second metal layer 66 are removed from stack 50 to expose first metal layer 62.

Patterning piezoelectric stack layer 61 according to the method of the present invention may be accomplished using lithography techniques combined with wet etch with phosphoric acid for the metal layers and tetramethylamonium-hydroxide. Other suitable chemistries for wet or dry etching of the layers are also commonly used by persons of ordinary skill in the art and may be used in carrying out the method of the present invention.

According to one embodiment, patterning piezoelectric stack layer 61 involves removing portions of second metal layer 66 and piezoelectric material layer 64, and patterning first metal layer 62 to remove a portion thereof (e.g., portion 72) and to leave a further portion thereof exposed as an electrode. Patterning the electrode may be carried out using a phosphoric acid wet etch or a plasma (dry) etch with chlorine or fluorine gas. If an adhesion layer is present, the adhesion layer may be removed with a wet etch based ammonia peroxide (e.g., for a titanium adhesion layer). A top view of the resulting product of this embodiment of patterning piezoelectric stack layer 61 is illustrated in FIG. 17, where electrode 24 is shown exposed.

Figure 14:
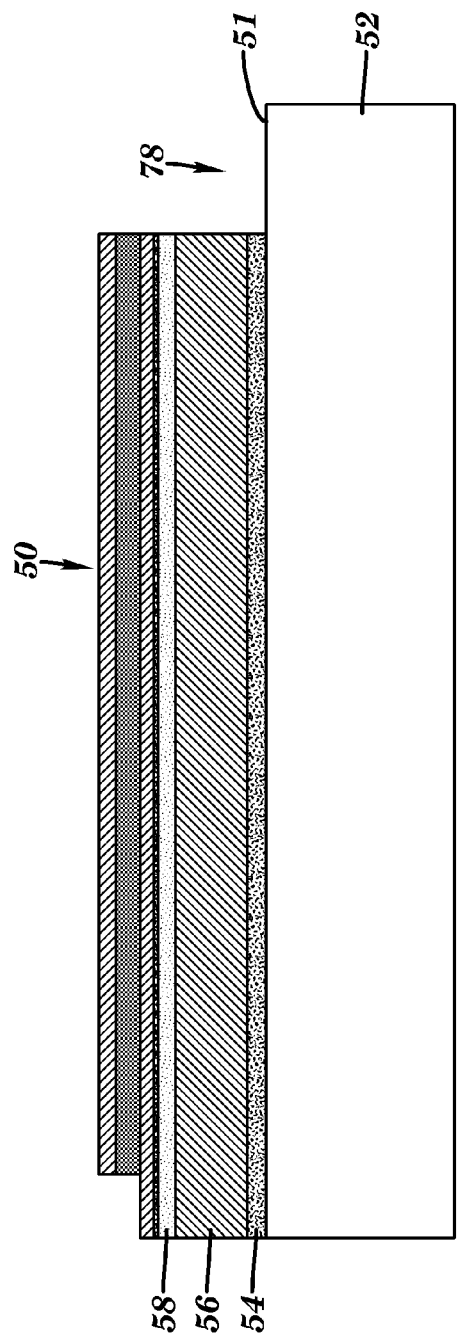
FIG. 14 is a side view of the layered material stack of FIG. 13, which has been further patterned, according to one embodiment of the method of producing an energy harvester device of the present invention, to remove portions of the second silicon dioxide layer, the cantilever material, and the first silicon dioxide layer from the layered material stack.

Next, second silicon dioxide layer 58, cantilever material 56, and first silicon dioxide layer 54 are patterned. This method step is illustrated in FIG. 14. According to one embodiment, patterning silicon dioxide layer 58, cantilever material 56, and first silicon dioxide layer 54 involves removing a portion of second silicon dioxide layer 58, a portion of cantilever material 56, and a portion of first silicon dioxide layer 54 to leave portion 78 of first surface 51 of silicon wafer 52 exposed.

Patterning second silicon dioxide layer 58, cantilever material 56, and first silicon dioxide layer 54 may further involve removing opposing side walls of second silicon dioxide layer 58, cantilever material 56, and first silicon dioxide layer 54 to form a cantilever material layer having side walls.

According to one embodiment, this patterning may be done entirely with dry processes. For example, fluorine $CHF_3/CF_4$ gases and a reactive ion etch for the oxides and $SF_6/C_4F_8$ deep reactive ion etch for the polySi. For a metal, such as Cu, Au, or Ni, a wet etch process well known in the art can be used. Alternatively, the Cu, Ni, or Au are added via electroplating after patterning of the silicon layers.

Figure 15:
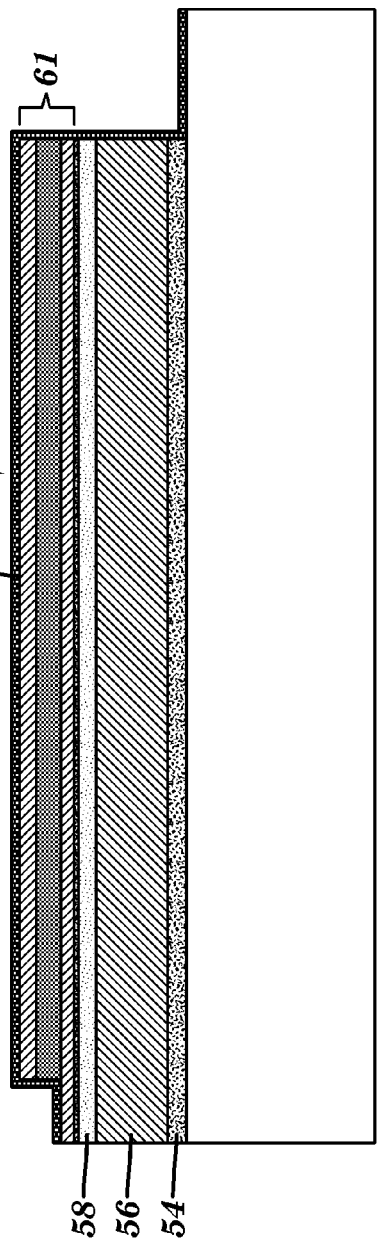
FIG. 15 is a side view of the layered material stack of FIG. 14, in which a third silicon dioxide layer has been deposited over the patterned piezoelectric stack layer and the patterned second silicon dioxide layer, cantilever material, and first silicon dioxide layer.

In a further (optional) method step illustrated in FIG. 15, third silicon dioxide layer 59 is deposited over the patterned piezoelectric stack layer 61 and the patterned second silicon dioxide layer 58, cantilever material 56, and first silicon dioxide layer 54. According to one embodiment, this step is carried out using plasma-enhanced chemical vapor deposition of silane (a silicon source) to deposit silicon for the passivation layer. This layer may be deposited to a thickness of about 1 µm. According to another embodiment, depositing the third silicon dioxide layer is an optional step that provides robustness to the structure against abrasion.

Figure 16:
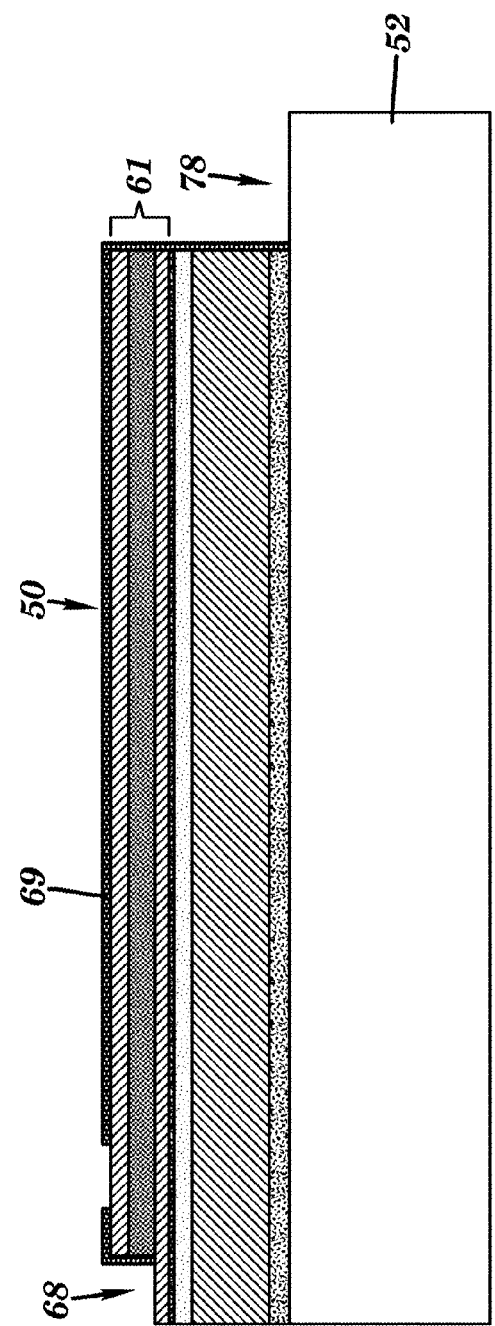
FIG. 16 is a side view of the layered material stack of FIG. 14, which has been patterned, according to one embodiment of the method of producing an energy harvesting device of the present invention, to remove a portion of the third silicon dioxide layer to leave a portion of the piezoelectric stack and a portion of the silicon wafer exposed.

In the next method step illustrated in FIG. 16, when present, third silicon dioxide layer 59 is patterned. According to one embodiment, this step involves removing a portion of third silicon dioxide layer 59 to leave portions 68 and 69 of piezoelectric stack layer 61 and portion 78 of the silicon wafer exposed. According to one embodiment, this patterning is carried out using the $CHF_3$ reactive ion etch process.

A further (optional) method step is illustrated in FIG. 17, which illustrates metal bondpad layer 80 deposited over the patterned third silicon dioxide layer 59, as well as portion 68 of piezoelectric stack layer 61 and portion 78 of silicon wafer 52. Bondpad layer 80 provides a surface that allows for a robust wire bond to be formed to the device, ensuring good electrical connection. According to one embodiment, metal bondpad layer 80 is deposited to a thickness of about 1 μm, and is a metal material (e.g., Al). This layer is deposited to improve reliability of the wire bond.

FIG. 18 illustrates the next method step, which involves patterning metal bondpad layer 80 when present. According to one embodiment, metal bondpad layer 80 is patterned slightly longer than openings for top and bottom electrode connections. In one embodiment, patterning of metal bondpad layer 80 is carried out using wet etch chemistry based on phosphoric acid. However, other methods may also be used.

The next process step is illustrated in FIG. 19, where silicon wafer 52 is etched at surface 53 to create resonator beam 12, base 20, mass 22, and stopper 14, thus producing one embodiment of the energy harvesting device of the present invention. In other words, portions of silicon wafer 52 are etched away to create a cavity 82 beneath what has become resonator beam 12 to create the separation between the portion of silicon wafer 52 that has become base 20 and portion of silicon wafer 52 that has become mass 22. Likewise, a portion of silicon wafer 52 is etched away to create stopper 14, which is resonator beam 12 extending beyond the edge of mass 52. According to one embodiment, etching silicon wafer 52 is carried out using lithography techniques and deep reactive ion etch with $SF_6/C_4F_8$ chemistry.

A further aspect of the present invention relates to a method of producing an energy harvester device. This method involves providing a silicon wafer having a first and second surface; depositing a first silicon dioxide layer on the first surface of the silicon wafer; depositing a cantilever material on the first silicon dioxide layer; depositing a second silicon dioxide layer on the cantilever material; depositing a piezoelectric stack on the second silicon dioxide layer; patterning the piezoelectric stack layer; patterning the second silicon dioxide layer, the cantilever material, and the first silicon dioxide layer; etching the second surface of the silicon wafer to define an energy harvester device. The energy harvester device comprises an elongate resonator beam extending between first and second ends; a base connected to the resonator beam at the first end with the second end being freely extending from the base as a cantilever; and a mass attached to the second end of the resonator beam. The method further involves depositing a stopper material and etching the stopper material to define a stopper at the second end of the elongate resonator beam.

In carrying out this method of the present invention, the same steps illustrated in FIGS. 12-18 are carried out. The next process step is illustrated in FIG. 20, where silicon wafer 52 is etched at surface 53 to create resonator beam 12, base 20, and mass 22. In other words, portions of silicon wafer 52 are etched away to create a cavity 82 beneath what has become resonator beam 12 to create the separation between the portion of silicon wafer 52 that has become base 20 and portion of silicon wafer 52 that has become mass 22. In contrast to what is illustrated in FIG. 19, this step does not involve etching away a portion of silicon wafer 52 to create stopper 14 at this stage.

Figure 21:
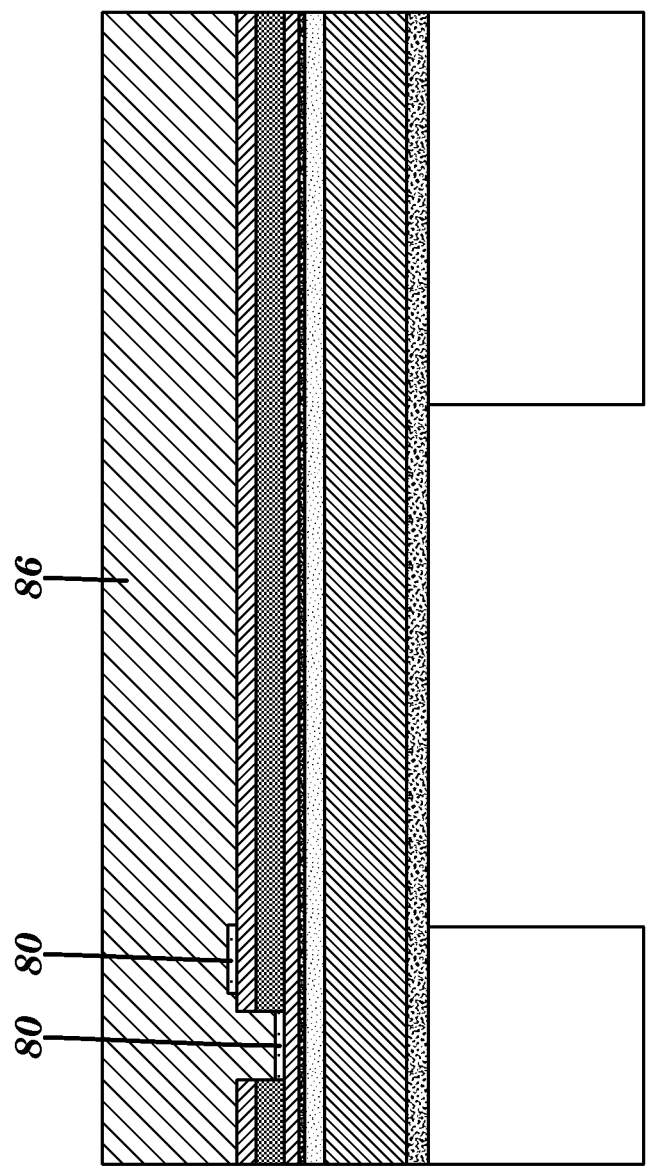
FIG. 21 is a side view of the layered material stack of FIG. 20, where a stopper material has been deposited onto the patterned metal bondpad layer.
Figure 22:
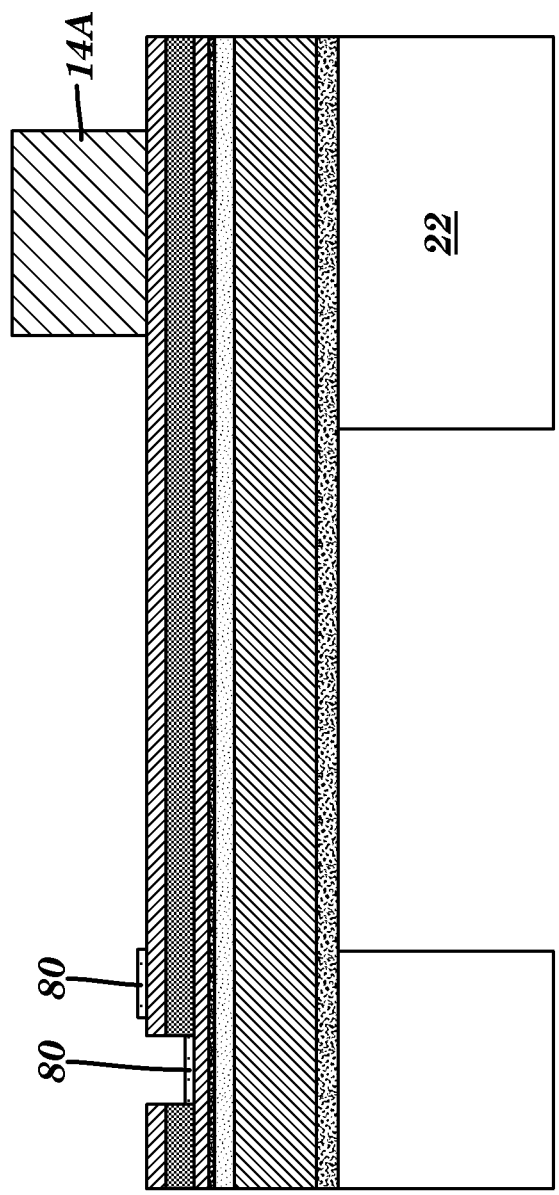
FIG. 22 is a side view of the layered material stack of FIG. 21, where the stopper material deposited onto the patterned metal bondpad layer has been etched to define a stopper structure over the mass.

Instead, the process continues as illustrated in FIG. 21, which involves depositing laminate material 86, which is, according to one embodiment, a photoresist laminate or polymer laminate on top of the structure on top of bondpad layer 80, when present, or piezoelectric stack layer 61.

The next process step involves etching laminate material 86 to form stopper 14A above mass 22.

Figure 23:
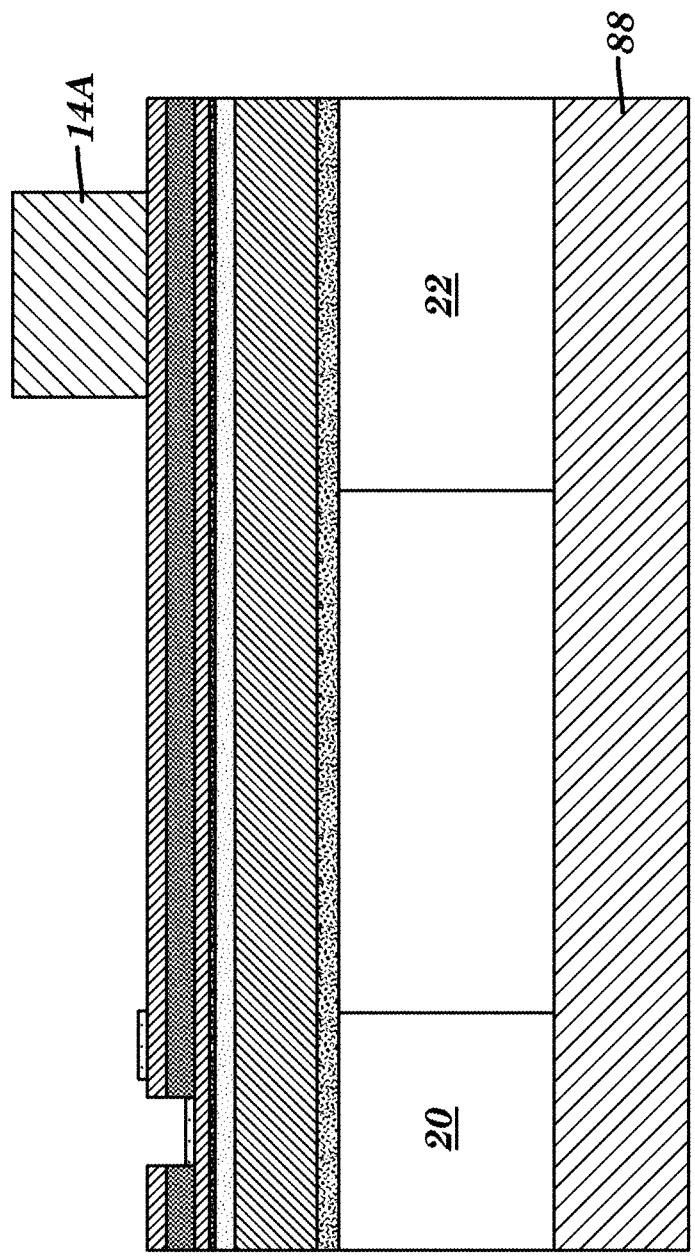
FIG. 23 is a side view of the layered material stack of FIG. 22, where a stopper material has been deposited onto the underside of the mass.
Figure 24:
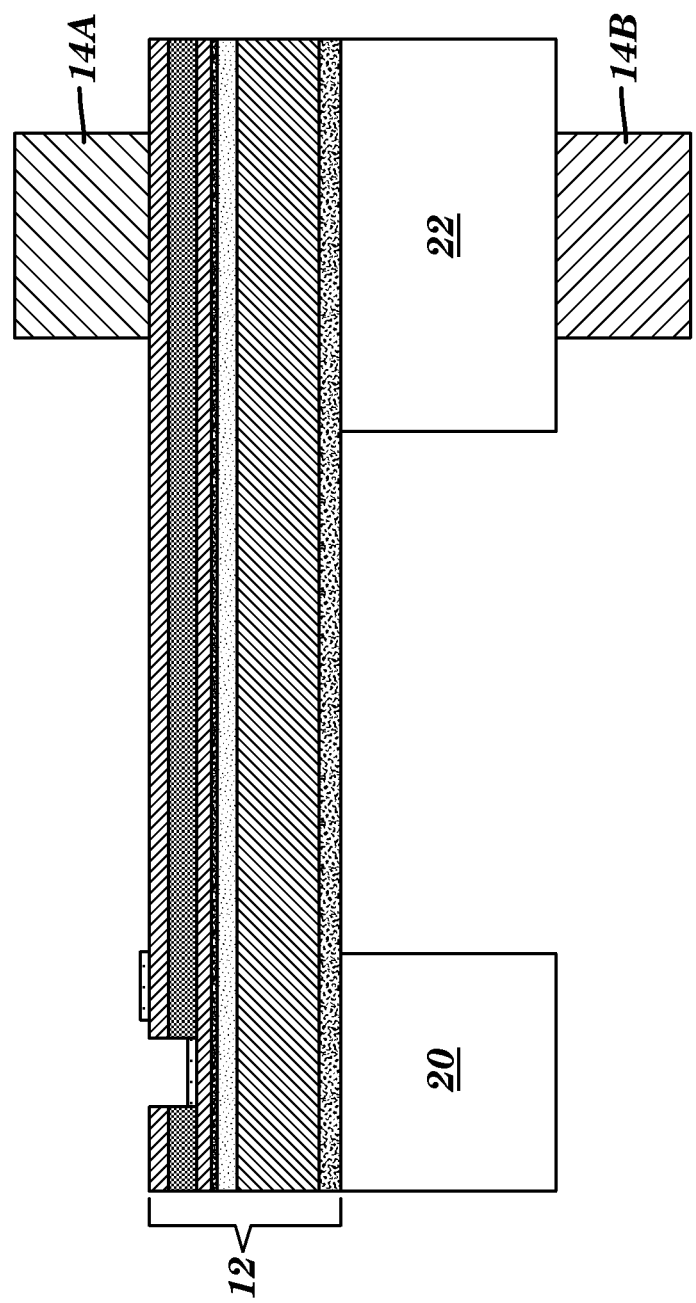
FIG. 24 is a side view of the layered material stack of FIG. 23, where the stopper material deposited onto the underside of the mass has been etched to define a stopper structure underneath the mass.

According to one embodiment, a stopper may also be formed underneath the mass. This can be carried out as illustrated in FIGS. 23-24. In particular, as illustrated in FIG. 23, laminate material 88 is deposited on the underside of the structure (i.e., under mass 22 and, if necessary, under base 20). As illustrated in FIG. 24, laminate material 88 is etched to form stopper 14B underneath mass 22.

Other options for defining the stopper on either side of the mass according to this aspect of the present invention include, without limitation, a physical deposition such as inkjet of an organic or inorganic material, or electroplating of a metal.

EXAMPLES

The following examples are provided to illustrate embodiments of the present invention but are by no means intended to limit its scope.

Example 1

Energy Harvester Device with an Integral Spring Tip Stopper

An energy harvester device of the present invention with a 3,146 μm long cantilever×20 μm thick polysilicon cantilever material; 4,000 μm long×725 μm thick mass; and a spring tip stopper on the end of the cantilever 1,000 μm long and corresponding 20 μm thick polysilicon material was placed in a cavity assembly with a 1 mm cavity depth above and below the cantilever. The assembly was then placed on a vibration source and tuned to a resonant frequency of 120 Hz. The tip of the cantilever started to hit the top of the cavity at an acceleration of 0.54 G with no damage to the cantilever. The assembly was shaken at accelerations as high as 3G in the same configuration, and no damage was observed to the cantilever and spring tip.

The same experiment was repeated with a 2 mm cavity. The device started hitting the top of the package at an acceleration of 0.75 G and no breakage was observed. In addition, no breakage was observed when the device was shaken at an acceleration of 3G.

All of the features described herein (including any accompanying claims, abstract and drawings), and/or all of the steps of any method or process so disclosed, may be combined with any of the above aspects in any combination, except combinations where at least some of such features and/or steps are mutually exclusive.

What is claimed:
1. An energy harvester device comprising:
an elongate resonator beam comprising a piezoelectric material, said resonator beam extending between first and second ends;
a base connected to the resonator beam at the first end with the second end being freely extending from the base as a cantilever;
a mass attached to the second end of the resonator beam;
a package surrounding at least a portion of the second end of the resonator beam, wherein the package defines interior walls which in their totality comprise no more than two horizontal interior surfaces defining first and second horizontal planes and no more than two vertical interior surfaces defining first and second vertical planes; and a stopper connected to the mass and/or the second end of the resonator beam, wherein the stopper is configured to prevent contact between the second end of the resonator beam and the package.

2. The device according to claim 1, wherein the stopper comprises a portion that extends from the second end and/or the mass.

3. The device according to claim 2, wherein the stopper is flexible.

4. The device according to claim 1, wherein the package is formed as a single structure with the base.

5. The device according to claim 1, wherein the stopper is connected to a single surface of the second end and/or the mass.

6. The device according to claim 1, wherein the stopper is connected to a first surface of the second end and/or the mass and a second surface of the second end and/or the mass.

7. The device according to claim 6, wherein the second surface of the second end and/or the mass opposes the first surface of the second end and/or the mass.

8. The device according to claim 1, wherein the stopper is constructed of a material selected from the group consisting of metal, photoresist, polyimide, $SiO_2$, and other complementary metal-oxide-semiconductor compatible material.

9. The device according to claim 1, wherein the resonator beam comprises a laminate formed of a plurality of layers.

10. The device according to claim 9, wherein the plurality of layers comprise at least two different materials.

11. The device according to claim 1 further comprising:
one or more electrodes in electrical contact with said piezoelectric material.

12. The device according to claim 11, wherein the one or more electrodes comprises a material selected from the group consisting of molybdenum and platinum.

13. The device according to claim 11 further comprising:
electrical harvesting circuitry in electrical connection with the one or more electrodes to harvest electrical energy from said piezoelectric material.

14. The device according to claim 1, wherein the piezoelectric material is selected from the group consisting of aluminum nitride, zinc oxide, and lead zirconate titinate compounds.

15. A system comprising:
an electrically powered apparatus and
the device according to claim 1 electrically coupled to the apparatus.

16. The system according to claim 15, wherein the electrically powered apparatus is selected from the group consisting of a laptop computer; a tablet computer; a cell phone; a smart phone; an e-reader; an MP3 player; a telephony headset; headphones; a router; a gaming device; a gaming controller; a mobile internet adapter; a camera; wireless sensors; wireless sensor motes (for networks monitoring industrial, rail, buildings, agriculture, etc.); tire pressure sensor monitors; powering simple displays on power tools; agriculture devices for monitoring livestock; medical devices; human body monitoring devices; and toys.

17. The system according to claim 15, wherein the stopper comprises a portion that extends from the second end and/or the mass.

18. The system according to claim 17, wherein the stopper is flexible.

19. The system according to claim 15, wherein the package is formed as a single structure with the base.

20. The system according to claim 15, wherein the stopper is connected to a single surface of the second end and/or the mass.

21. The system according to claim 15, wherein the stopper is connected to a first surface of the second end and/or the mass a second surface of the second end and/or the mass.

22. The system according to claim 21, wherein the second surface of the second end and/or the mass opposes the first surface of the second end and/or the mass.

23. The system according to claim 15, wherein the stopper is constructed of a material selected from the group consisting of metal, photoresist, polyimide, $SiO_2$, and other complementary metal-oxide-semiconductor compatible material.

24. The system according to claim 15, wherein the resonator beam comprises a laminate formed of a plurality of layers.

25. The system according to claim 24, wherein the plurality of layers comprise at least two different materials.

26. The system according to claim 15 further comprising:
one or more electrodes in electrical contact with said piezoelectric material.

27. The system according to claim 26, wherein the one or more electrodes comprises a material selected from the group consisting of molybdenum and platinum.

28. The system according to claim 26 further comprising:
electrical harvesting circuitry in electrical connection with the one or more electrodes to harvest electrical energy from said piezoelectric material.

29. The system according to claim 15, wherein the piezoelectric material is selected from the group consisting of aluminum nitride, zinc oxide, and lead zirconate titinate compounds.

30. A method of powering an electrically powered apparatus, said method comprising:
providing the system according to claim 15;
subjecting the system to movement or vibrations to generate electrical energy from said piezoelectric material; and
transferring said electrical energy from said piezoelectric material to said apparatus to provide power to the apparatus.

31. The method according to claim 30, wherein said apparatus is selected from the group consisting of a laptop computer; a tablet computer; a cell phone; a smart phone; an e-reader; an MP3 player; a telephony headset; headphones; a router; a gaming device; a gaming controller; a mobile internet adapter; a camera; wireless sensors; wireless sensor motes (for networks monitoring industrial, rail, buildings, agriculture, etc.); tire pressure sensor monitors; powering simple displays on power tools; agriculture devices for monitoring livestock; medical devices; human body monitoring devices; and toys.

32. The method according to claim 30, wherein the stopper comprises a portion that extends from the second end and/or the mass.

33. The method according to claim 32, wherein the stopper is flexible.

34. The method according to claim 30, wherein the package is formed as a single structure with the base.

35. The method according to claim 30, wherein the stopper is connected to a single surface of the second end and/or the mass.

36. The method according to claim 30, wherein the stopper is connected to a first surface of the second end and/or the mass a second surface of the second end and/or the mass.

37. The method according to claim 36, wherein the second surface of the second end and/or the mass opposes the first surface of the second end and/or the mass.

38. The method according to claim 30, wherein the stopper is constructed of a material selected from the group consisting of metal, photoresist, polyimide, $SiO_2$, and other complementary metal-oxide-semiconductor compatible material.

39. The method according to claim 30, wherein the resonator beam comprises a laminate formed of a plurality of layers.

40. The method according to claim 39, wherein the plurality of layers comprise at least two different materials.

41. The method according to claim 30, wherein the system further comprises:
   one or more electrodes in electrical contact with said piezoelectric material.

42. The method according to claim 41, wherein the one or more electrodes comprises a material selected from the group consisting of molybdenum and platinum.

43. The method according to claim 41, wherein the system further comprises:
   electrical harvesting circuitry in electrical connection with the one or more electrodes to harvest electrical energy from said piezoelectric material.

44. The method according to claim 30, wherein the piezoelectric material is selected from the group consisting of aluminum nitride, zinc oxide, and lead zirconate titinate compounds.

\* \* \* \* \*